(12) United States Patent
Takagiwa

(10) Patent No.: US 10,998,055 B2
(45) Date of Patent: May 4, 2021

(54) SEMICONDUCTOR STORAGE DEVICE

(71) Applicant: Kioxia Corporation, Minato-ku (JP)

(72) Inventor: Teruo Takagiwa, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/820,809

(22) Filed: Mar. 17, 2020

(65) Prior Publication Data

US 2021/0065818 A1 Mar. 4, 2021

(30) Foreign Application Priority Data

Sep. 2, 2019 (JP) .............................. JP2019-159714

(51) Int. Cl.
*G11C 16/04* (2006.01)
*G11C 16/26* (2006.01)

(52) U.S. Cl.
CPC .......... *G11C 16/26* (2013.01); *G11C 16/0483* (2013.01)

(58) Field of Classification Search
CPC ............................ G11C 16/26; G11C 16/0483
USPC ..................................................... 365/185.21
See application file for complete search history.

(56) References Cited

U.S. PATENT DOCUMENTS

| 9,666,296 | B1 | 5/2017 | Maejima |
| 2009/0154243 | A1* | 6/2009 | Ohtake ............... G11O 29/1201 365/185.11 |
| 2013/0235676 | A1* | 9/2013 | Takagiwa ................ G11O 7/06 365/189.05 |
| 2013/0314992 | A1 | 11/2013 | Takagiwa |
| 2016/0247549 | A1 | 8/2016 | Takagiwa |
| 2018/0054190 | A1 | 2/2018 | Takagiwa |
| 2018/0247695 | A1 | 8/2018 | Kasai et al. |

FOREIGN PATENT DOCUMENTS

| JP | 2014-120184 A | 6/2014 |
| JP | 2016-157495 A | 9/2016 |
| JP | 2017-157260 A | 9/2017 |
| JP | 2018-29301 A | 2/2018 |
| JP | 2018-142388 A | 9/2018 |

\* cited by examiner

*Primary Examiner* — Vu A Le

(74) *Attorney, Agent, or Firm* — Oblon, McClelland, Maier & Neustadt, L.L.P.

(57) ABSTRACT

According to one embodiment, a semiconductor storage device is disclosed. The device includes a memory cell array including memory cells, bit lines connected to the memory cell array, sense amplifier units provided to correspond to bit lines and arranged in a matrix of M rows and N columns, data latches provided to correspond to sense amplifier units and arranged in a matrix of S rows and T columns. M, N, S, and T are positive integers, satisfying M<S, N>T, and S×T=M×N. A dimension of each of the sense amplifier units in an arrangement direction of the N columns is smaller than a dimension of each of the data latches in an arrangement direction of the T columns.

13 Claims, 17 Drawing Sheets

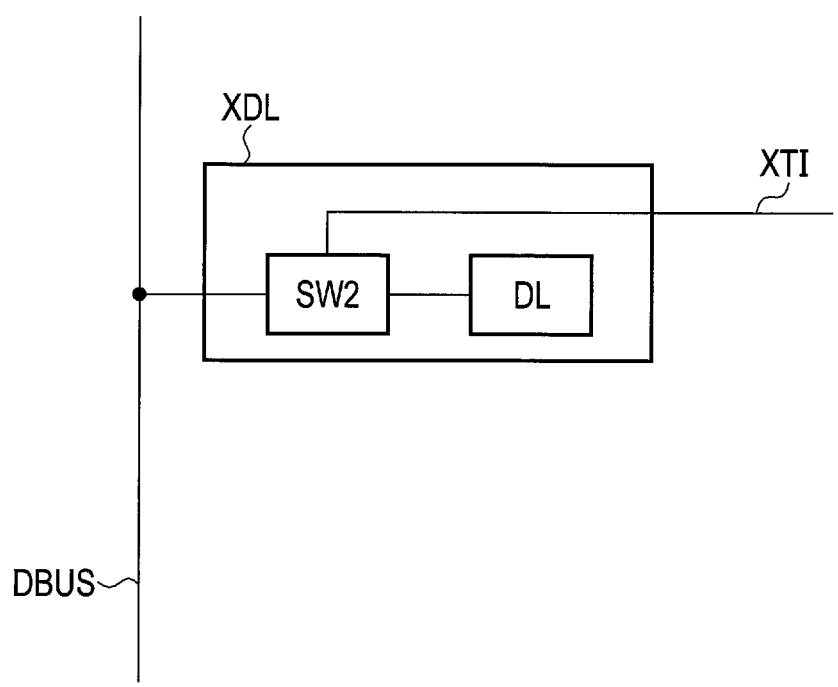
F I G. 7

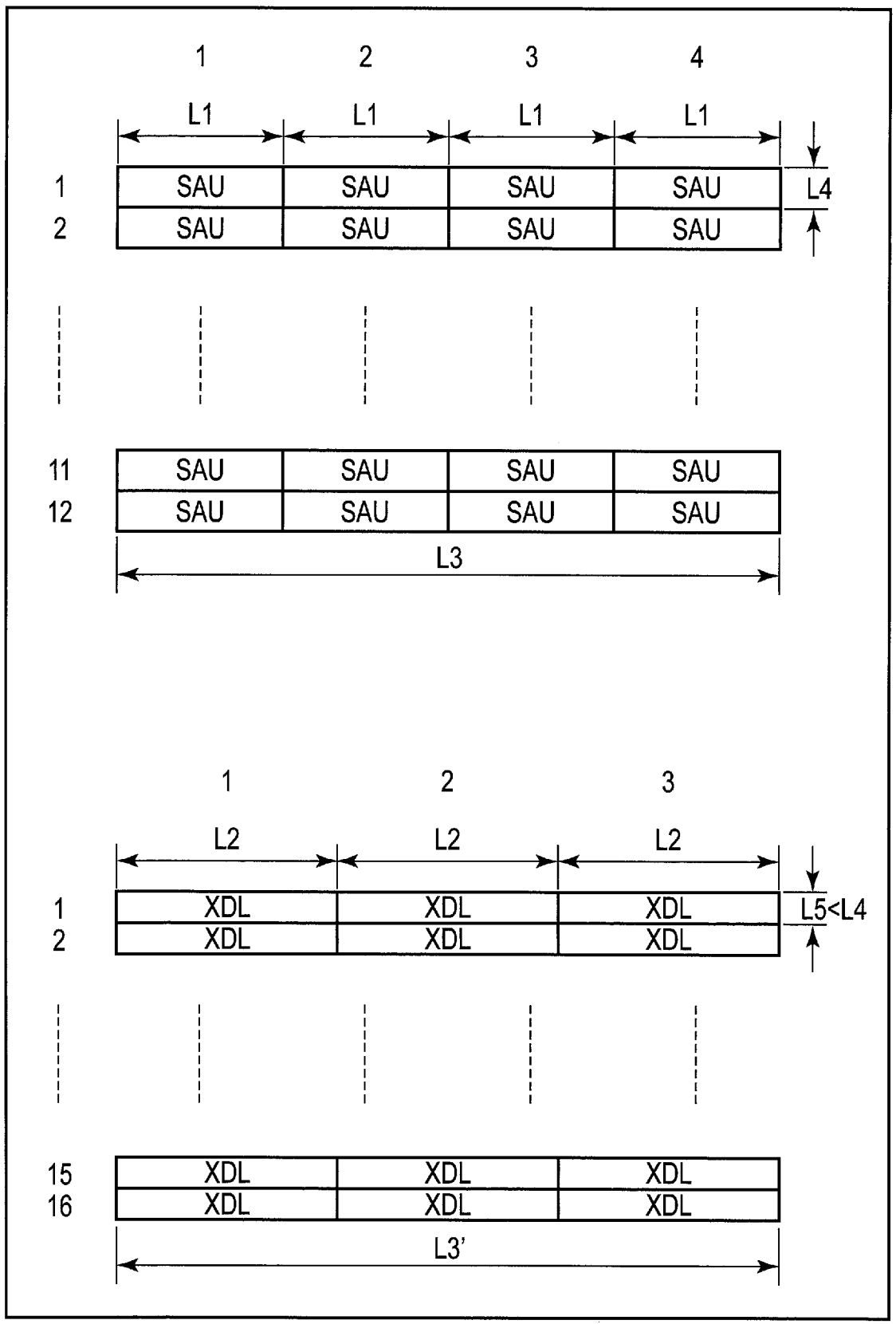
F I G. 9A

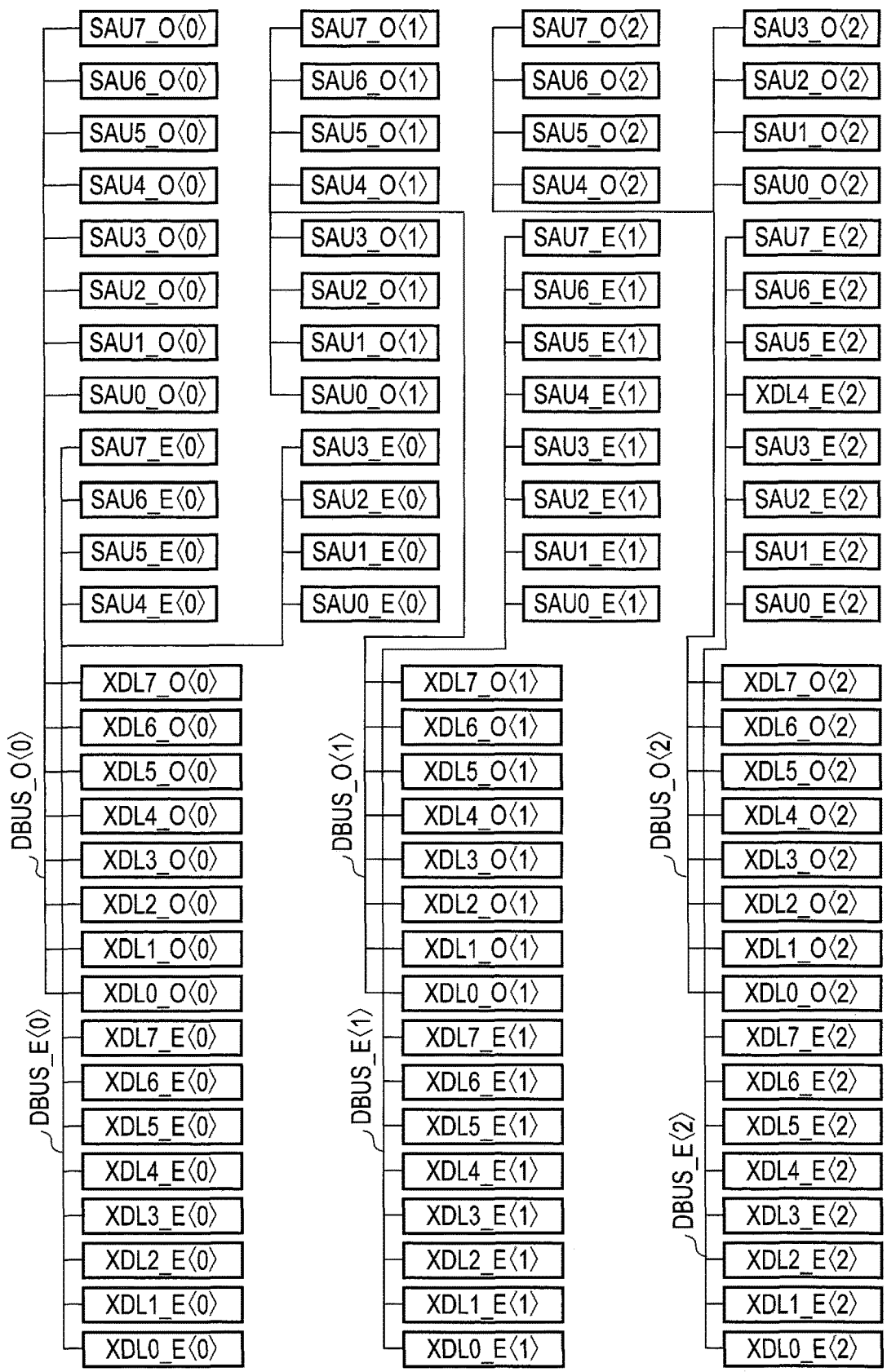
F I G. 10

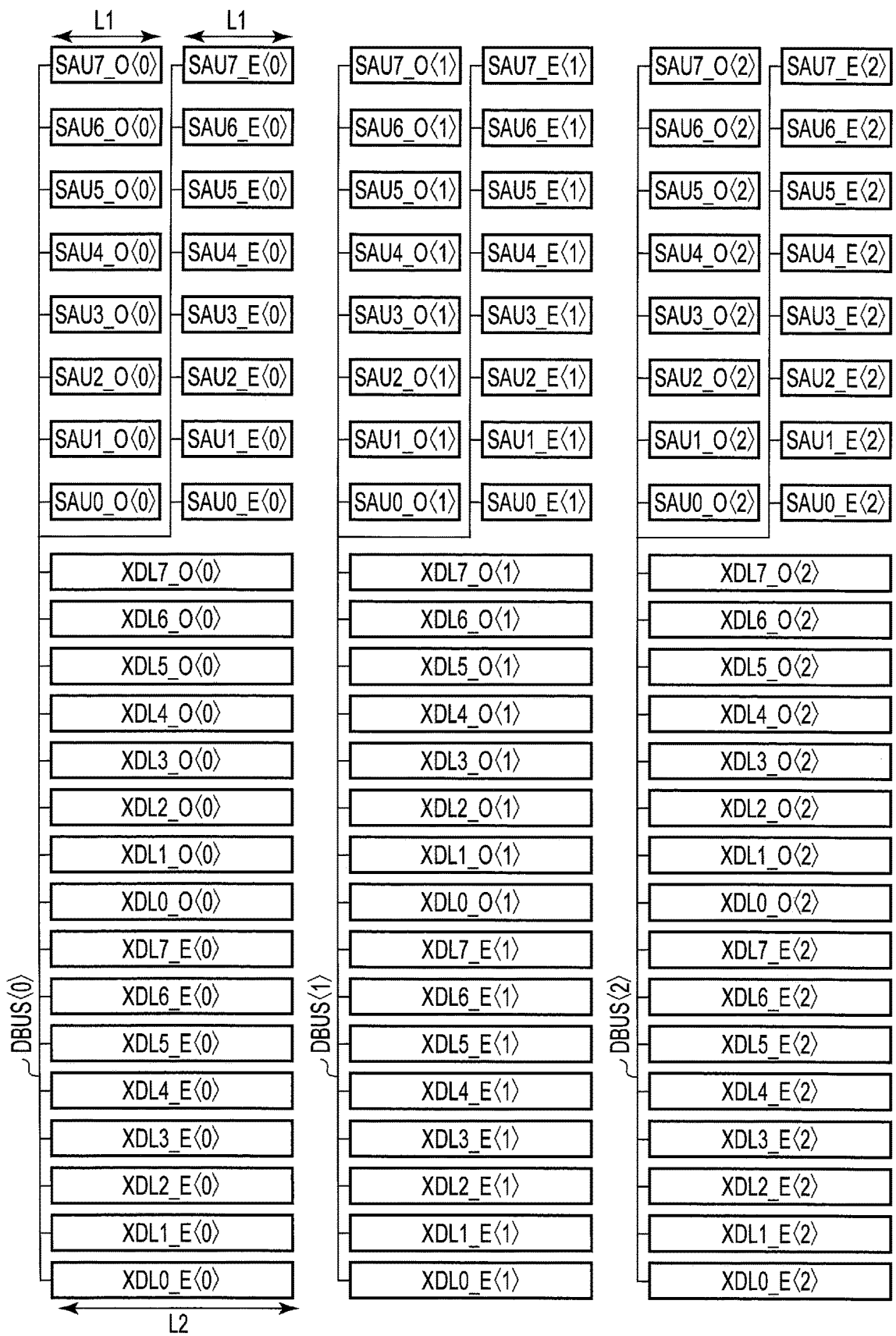
F I G. 12

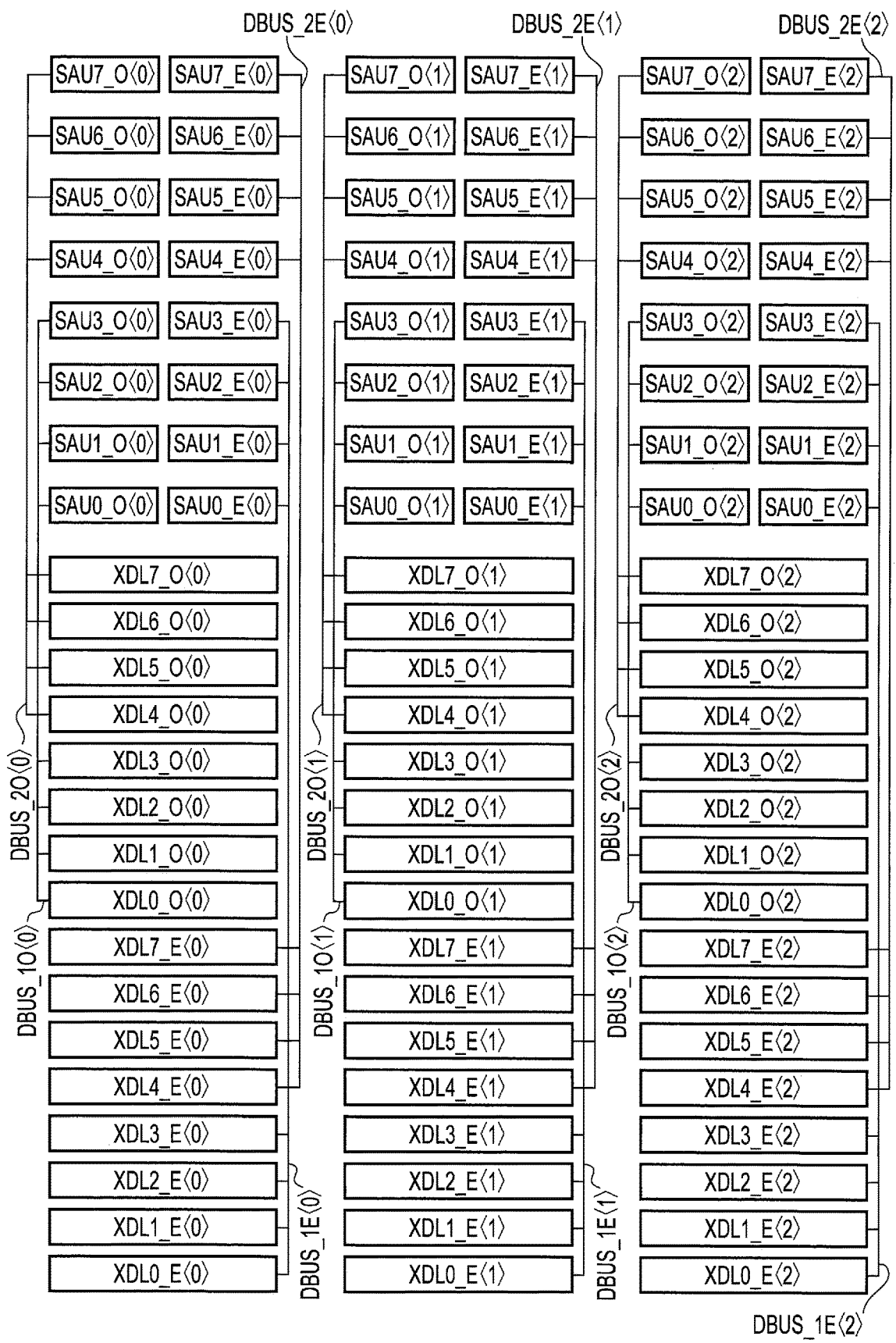
F I G. 15

SEMICONDUCTOR STORAGE DEVICE

CROSS-REFERENCE TO RELATED APPLICATIONS

This application is based upon and claims the benefit of priority from Japanese Patent Application No. 2019-159714, filed Sep. 2, 2019, the entire contents of which are incorporated herein by reference.

FIELD

Embodiments described herein relate generally to a semiconductor storage device.

BACKGROUND

A NAND type flash memory is known as one of nonvolatile semiconductor storage devices.

BRIEF DESCRIPTION OF THE DRAWINGS

FIG. 7 is a block diagram illustrating the data latch.

FIG. 9A is a plan view for explaining dimensions of the sense amplifier units and data latches.

FIG. 10 is a diagram illustrating a planar layout of a plurality of sense amplifier units and a plurality of data latches of a NAND type flash memory according to a second embodiment.

FIG. 12 is a diagram illustrating a planar layout of a plurality of sense amplifier units and a plurality of data latches of a NAND type flash memory according to a fourth embodiment.

FIG. 15 is a diagram illustrating a planar layout of a plurality of sense amplifier units and a plurality of data latches of a NAND type flash memory according to a sixth embodiment.

DETAILED DESCRIPTION

Figure 1:
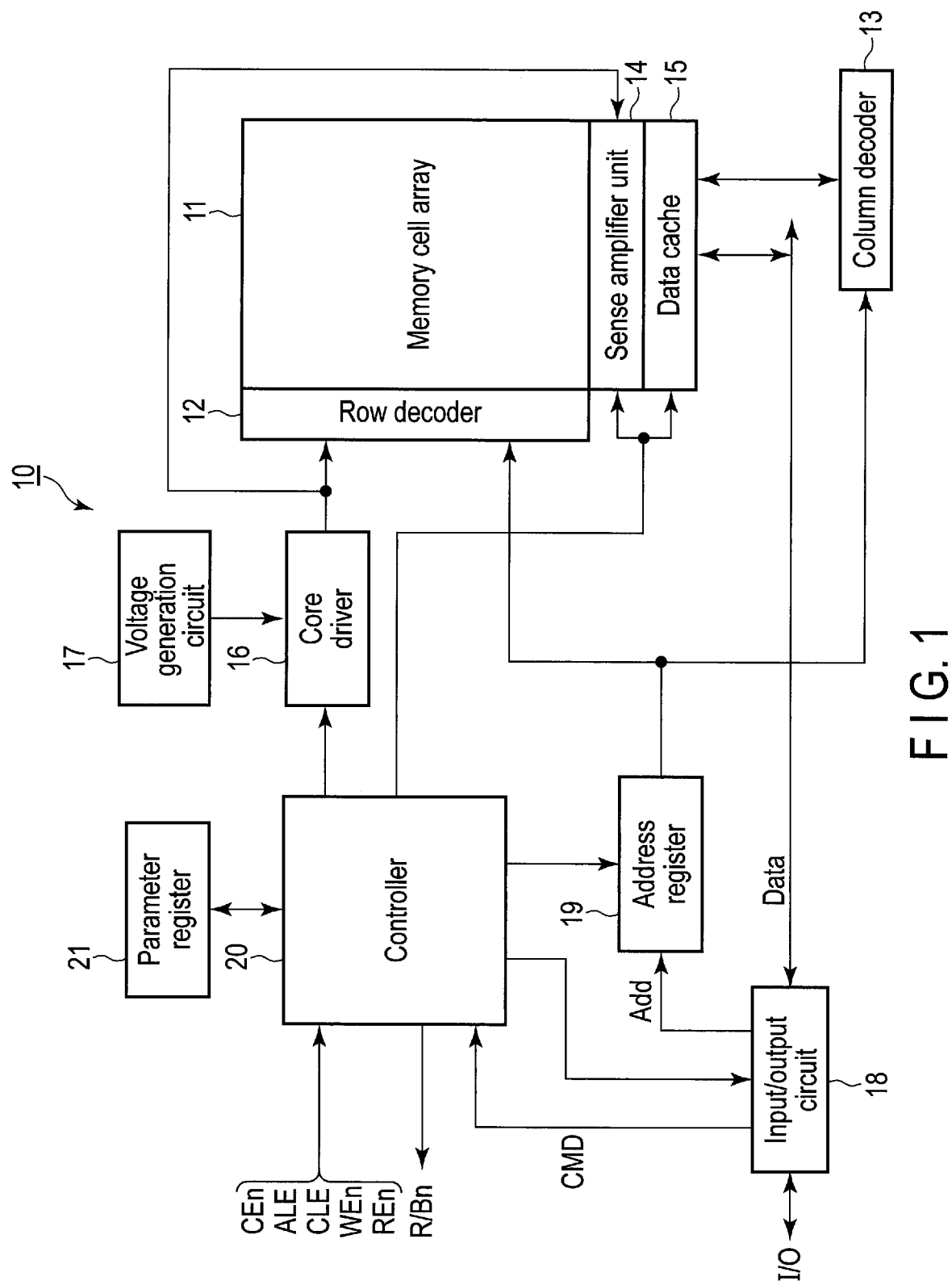
FIG. 1 is a block diagram illustrating a NAND type flash memory according to an embodiment.

In general, according to one embodiment, a semiconductor storage device is disclosed. The semiconductor storage device includes a memory cell array including a plurality of memory cells, a plurality of bit lines connected to the memory cell array, a plurality of sense amplifier units provided to correspond to the plurality of bit lines and arranged in a matrix of M rows and N columns, a plurality of data latches provided to correspond to the plurality of sense amplifier units and arranged in a matrix of S rows and T columns. M, N, S, and T are positive integers, satisfying M<S, N>T, and S×T=M×N. A dimension (length) of each of the sense amplifier units in an arrangement direction of the N columns is smaller than a dimension (length) of each of the data latches in an arrangement direction of the T columns.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

FIG. 1 is a block diagram illustrating a NAND type flash memory 10 according to the present embodiment.

The NAND type flash memory 10 comprises a memory cell array 11, a row decoder 12, a column decoder 13, a sense amplifier portion 14, a data cache 15, a core driver 16, a voltage generation circuit 17, an input/output circuit 18, an address register 19, a controller 20, and a parameter register 21.

The memory cell array 11 comprises a plurality of blocks, and each of the plurality of blocks comprises a plurality of memory cell transistors (which may be simply referred as memory cells). The memory cell transistor is comprised of, for example, an electrically rewritable EEPROM (registered trademark) cell. In the memory cell array 11, a plurality of bit lines, a plurality of word lines, and a source line are arranged to control the voltage applied to the memory cell transistor. Details of the memory cell array 11 will be described later.

The row decoder 12 receives a block address signal and a row address signal from the address register 19 and selects any one of word lines in the corresponding block based on these signals. The column decoder 13 receives a column address signal from the address register 19 and selects any one of bit lines based on the column address signal.

When the data is read, the sense amplifier portion 14 detects and amplifies data read from the memory cell onto the bit line. In addition, when the data is written, the sense amplifier portion 14 transfers write data to the bit line. The reading and writing of data from and to the memory cell array 11 are executed in a unit of memory cells, and this unit is used as a page.

The data cache 15 holds the data by a unit of page. When the data is read, the data cache 15 temporarily holds the data transferred from the sense amplifier portion 14 by a unit of page, and transfers the data serially to the input/output circuit 18. In addition, when the data is written, the data cache 15 temporarily holds the data serially transferred from the input/output circuit 18 and transfers the data to the sense amplifier portion 14 by a unit of page.

The core driver 16 supplies voltage necessary for the write, read, and erase of data to the row decoder 12, the sense amplifier portion 14, a source line driver (not illustrated), and the like. The voltage supplied by the core driver 16 is applied to the memory cell (more specifically, a word line, a select gate line, a bit line, and a source line) via the row decoder 12, the sense amplifier portion 14, and the source line driver.

The voltage generation circuit 17 generates an internal voltage (for example, a voltage obtained by boosting a power supply voltage) necessary for respective operations, and supplies the internal voltage to the core driver 16.

The controller 20 controls the whole operations of the NAND type flash memory 10. The controller 20 receives various external control signals, for example, a chip enable signal CEn, an address latch enable signal ALE, a command latch enable signal CLE, a write enable signal WEn, and a read enable signal REn from an external host device (not illustrated). In this example, n attached to the signal name is indicative of an active row.

The controller 20 distinguishes an address Add and a command CMD which are supplied from an input/output terminal I/O based on the external control signals. Then, the controller 20 transfers the address Add to the column decoder 13 and the row decoder 12 via the address register 19. In addition, the controller 20 decodes a command CMD. The controller 20 executes each sequence control of read, write, and erase of data in accordance with the external control signal and the command CMD. In addition, the controller 20 outputs a ready/busy signal R/Bn to notify the host device of an operation state of the NAND type flash memory 10. The host device can recognize the state of the NAND type flash memory 10 by receiving the ready/busy signal R/Bn.

The input/output circuit 18 executes transmission/reception of the data (including a command CMD, an address Add, and data) to/from the host device via a NAND bus.

For example, the parameter register 21 temporarily holds management data read from a ROM fuse of the memory cell array 11 at power-on. In addition, the parameter register 21 temporarily holds various types of data necessary for the operation of the memory cell array 11. The parameter register 21 is comprised of, for example, an SRAM.

Figure 2:
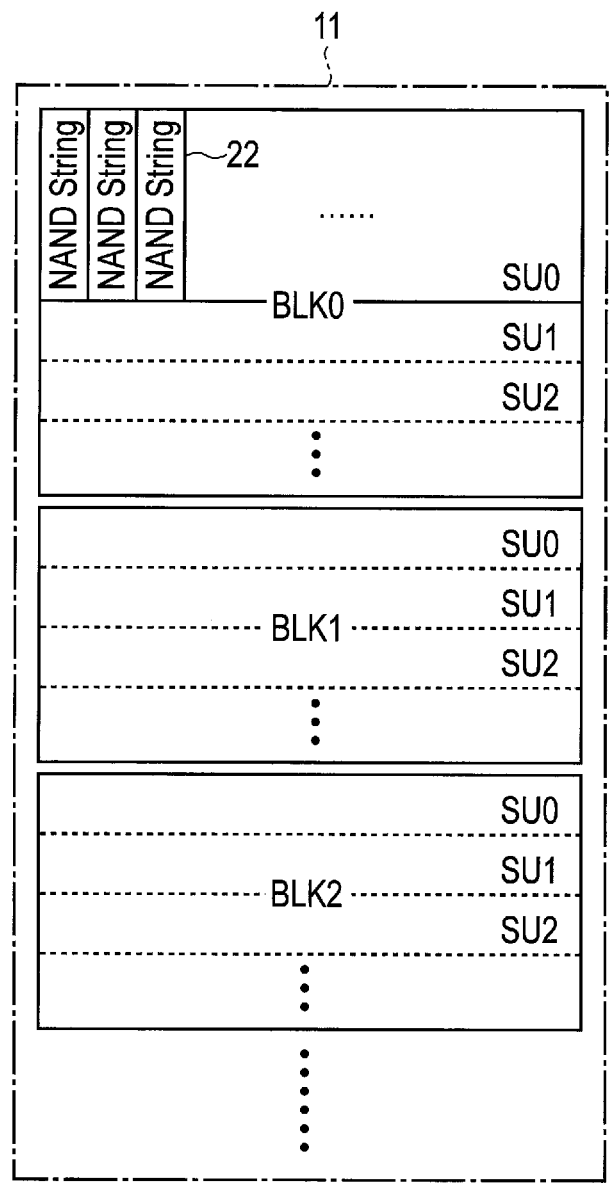
FIG. 2 is a block diagram illustrating a memory cell array.

FIG. 2 is a block diagram illustrating the memory cell array 11. The memory cell array 11 comprises a plurality of blocks BLK (BLK0, BLK1, BLK2, ... ). Each of the plurality of blocks BLK comprises a plurality of string units SU (SU0, SU1, SU2, ... ). Each of the plurality of string units SU includes a plurality of NAND strings 22. The number of blocks in the memory cell array 11, the number of string units in one block BLK, and the number of NAND strings in one string unit SU can be set freely.

Figure 3:
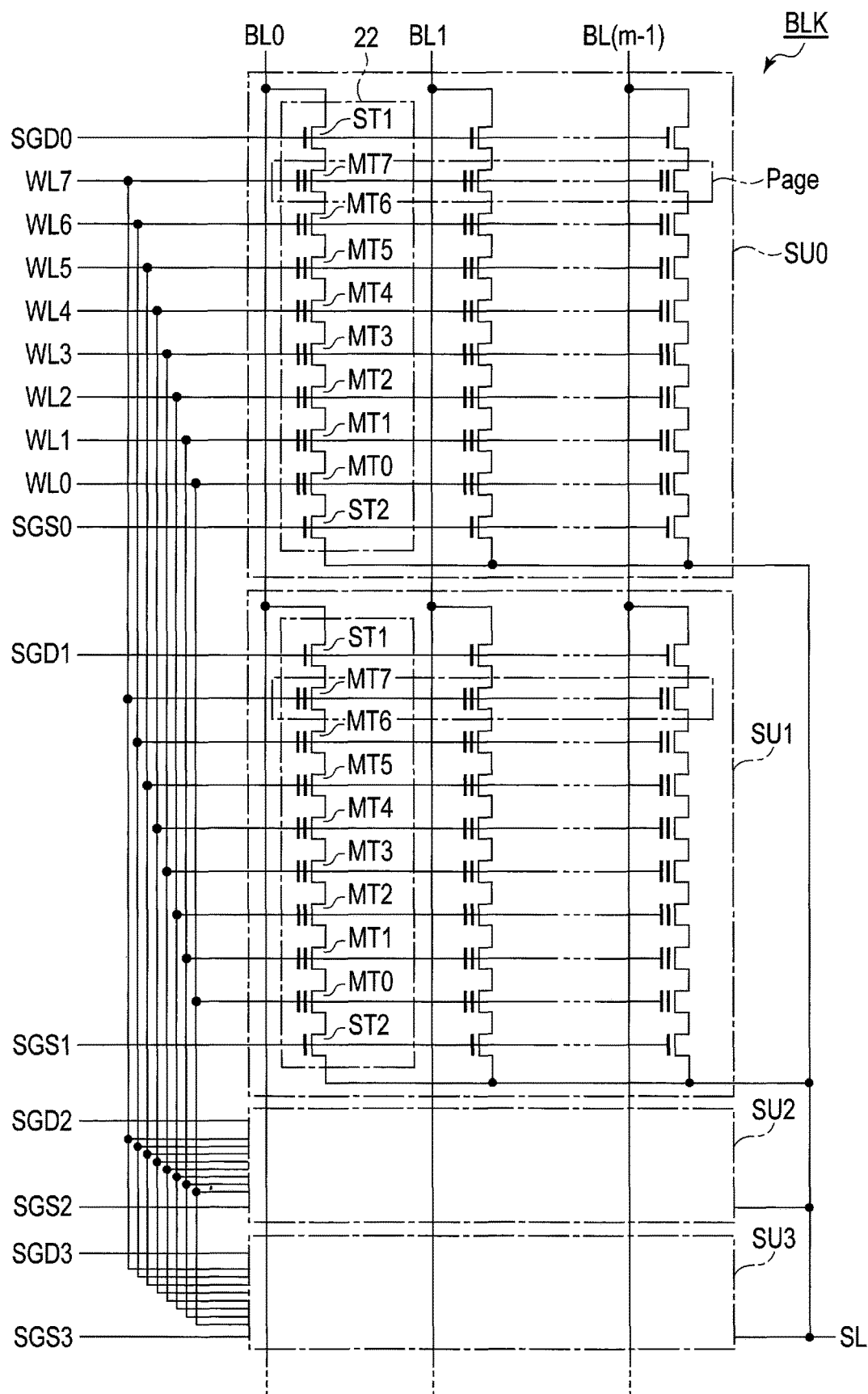
FIG. 3 is a circuit diagram illustrating a block included in the memory cell array.

FIG. 3 is a circuit diagram illustrating one of blocks BLK included in the memory cell array 11. Each of the plurality of NAND strings 22 includes a plurality of memory cell transistors MT and two select transistors ST1 and ST2. In the present specification, the memory cell transistor may be referred to as a memory cell or a cell. FIG. 3 illustrates a configuration example that the NAND string 22 includes eight memory cell transistors MT (MT0 to MT7), but the number of memory cell transistors MT in the NAND string 22 can be set freely. Each of the memory cell transistors MT comprises a stack gate including a control gate and a charge storage layer, and stores the data in a nonvolatile manner. The memory cell transistors MT may be configured to store one-bit data (binary) or two or more bits of data (or ternary or higher).

The plurality of memory cell transistors MT are arranged such that their current paths are connected in series between the select transistors ST1 and ST2. The current path of the memory transistor MT on one end side of the serial connection is connected to one end of the current path of the select transistor ST1, and the current path of the memory transistor MT on other end side of the serial connection is connected to one end of the current path of the select transistor ST2.

Gates of a plurality of select transistors ST1 included in the string unit SU0 are commonly connected to a select gate line SGD0 and, similarly, select gate lines SGD1 to SGD3 are connected to the string units SU1 to SU3, respectively. Gates of a plurality of select transistors ST2 included in the string unit SU0 are commonly connected to a select gate line SGS0 and, similarly, select gate lines SGS1 to SGS3 are connected to the string units SU1 to SU3, respectively. Note that the gates of the plurality of select transistors ST2 in the same block BLK may be commonly connected to the same select gate line SGS. Control gates of the memory cell transistors MT0 to MT7 in the same block BLK are connected to the word lines WL0 to WL7, respectively.

Among the NAND strings 22 arranged in a matrix in the memory cell array 11, the other end of the current path of the select transistor ST1 of the plurality of NAND strings 22 in the same column is commonly connected to any one of the bit lines BL0 to BL(m−1). Here, m is an integer of 1 or more. That is, one bit line BL commonly connects NAND strings 22 in the same column between the blocks BLK. The other end of the current path of the select transistors included in the same block BLK is commonly connected to the source line. For example, the source line SL commonly connects the NAND strings 22 between the blocks.

For example, data of the memory cell transistors MT in the same block BLK are erased at a time. Data read and data write are executed at a time for the memory cell transistors MT commonly connected to one word line WL arranged in one block BLK. This data unit is referred to as a page.

In addition, erasing the data can be executed in the block BLK unit or in a unit smaller than the block BLK.

Next, the sense amplifier portion 14 and the data cache 15 will be further described. The sense amplifier portion 14 includes a plurality of sense amplifier units provided to correspond to the bit lines. The data cache 15 includes a plurality of data latches provided to correspond to the sense amplifier units.

Figure 4:
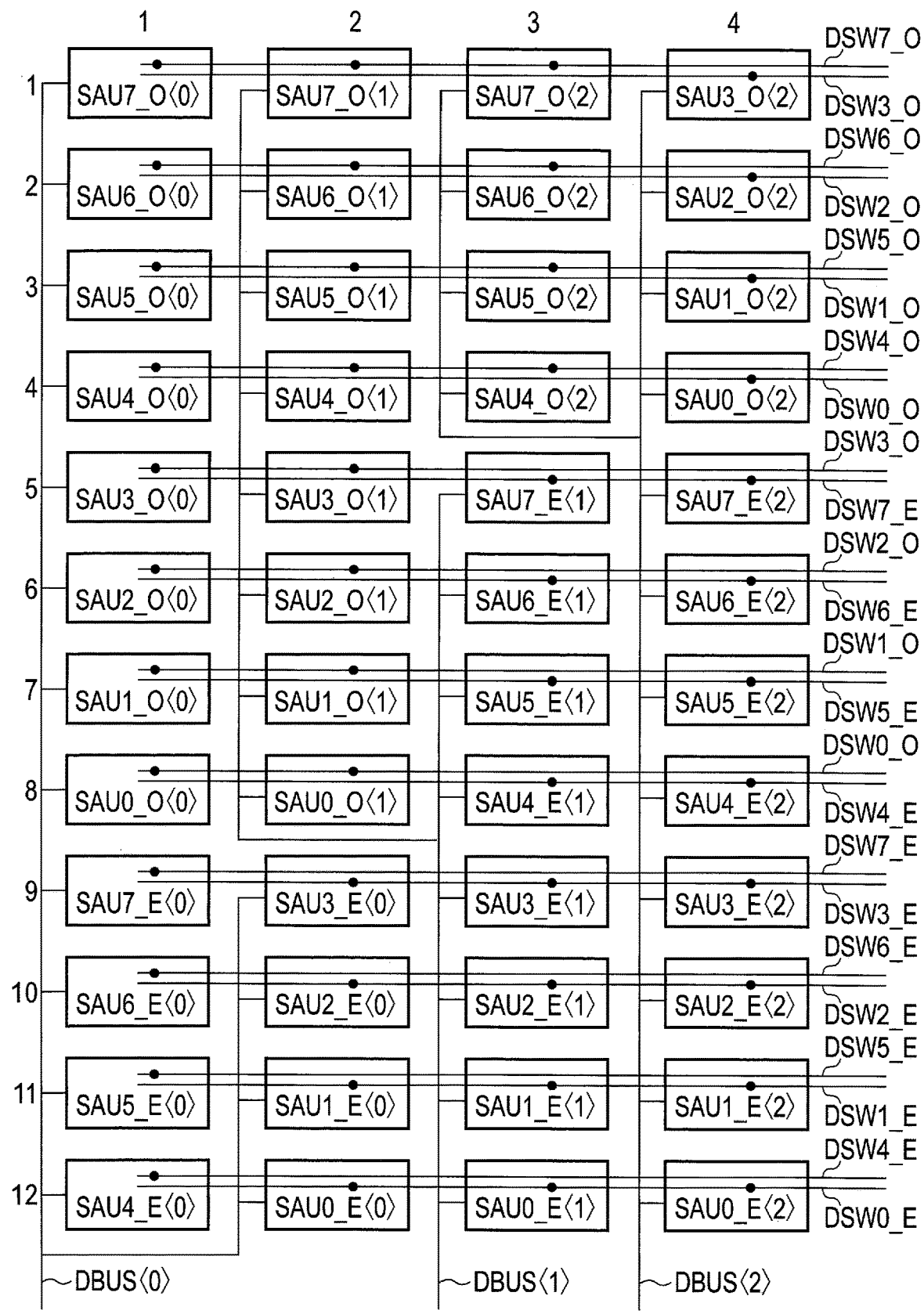
FIG. 4 is a plan view illustrating a plurality of sense amplifier units and a plurality of signal lines thereon.

In the present embodiment, the sense amplifier portion 14 includes 12×4 (=48) sense amplifier units SAUi_j<k> (i is 0, 1, ... , 7, j is E, O, and k is 0, 1, 2) which are arrayed in a matrix of 12 rows and 4 columns as illustrated in a plan view of FIG. 4.

As illustrated in FIG. 4, the column numbers of the sense amplifier units SAUi_j<k> are 1 to 4 in order from the left, and the row numbers of the sense amplifier units SAUi_j<k> are 1 to 12 in order from the top. The sense amplifier units SAUi_j<k> may be referred to as sense amplifier units SAU when distinction thereof is not unnecessary.

Twelve sense amplifier units SAU7_O<0> to SAU4_E<0> in the 1st row and 1st column to the 12th row and 1st column, and four sense amplifier units SAU3_E<0> to SAU0_E<0> in the 9th row and 2nd column to the 12th row and 2nd column are connected to data bus DBUS<0> (first data bus). In the following descriptions, these sixteen sense amplifier units SAU may be referred to as sense amplifier units SAU of a first group.

Eight sense amplifier units SAU7_O<1> to SAU0_O<1> in the 1st row and 2nd column to the 8th row and 2nd column, and eight sense amplifier units SAU7_E<1> to SAU0_E<1> in the 5th row and 3rd column to the 12th row and 3rd column are connected to data bus DBUS<1> (second data bus). In the following descriptions, these sixteen sense amplifier units SAU may be referred to as sense amplifier units SAU of a second group.

Four sense amplifier units SAU7_O<2> to SAU4_O<2> in the 1st row and 3rd column to the 4th row and 3rd column, and twelve sense amplifier units SAU3_O<2> to SAU0_E<2> in the 1st row and 4th column to the 12th row and 4th column are connected to data bus DBUS<2> (third data bus). In the following descriptions, these sixteen sense amplifier units SAU may be referred to as sense amplifier units SAU of a third group.

In the following descriptions, data buses DBUS<0>, DBUS<1>, and DBUS<2> are referred to as data buses DBUS when distinction thereof is not unnecessary.

Twenty-four signal lines DSWu_v (u is 0 to 7, v is O or E) are provided on 48 sense amplifier units SAU as illustrated in FIG. 4. More specifically, the signal lines DSWu_v are provided in the following manners.

Two signal lines DSW7_O and DSW3_O are provided on four sense amplifier units SAU in the 1st row and 1st column to the 1st row and 4th column. Two signal lines DSW6_O and DSW2_O are provided on four sense amplifier units SAU in the 2nd row and 1st column to the 2nd row and 4th column. Two signal lines DSW5_O and DSW1_O are provided on four sense amplifier units SAU in the 3rd row and 1st column to the 3rd row and 4th column. Two signal lines DSW4_O and DSW0_O are provided on four sense amplifier units SAU in the 4th row and 1st column to the 4th row and 4th column. Two signal lines DSW3_O and DSW7_E are provided on four sense amplifier units SAU in the 5th row and 1st column to the 5th row and 4th column. Two signal lines DSW2_O and DSW6_E are provided on four sense amplifier units SAU in the 6th row and 1st column to the 6th row and 4th column. Two signal lines DSW1_O and DSW5_E are provided on four sense amplifier units SAU in the 7th row and 1st column to the 7th row and 4th column. Two signal lines DSW0_O and DSW4_E are provided on four sense amplifier units SAU in the 8th row and 1st column to the 8th row and 4th column. Two signal lines DSW7_E and DSW3_E are provided on four sense amplifier units SAU in the 9th row and 1st column to the 9th row and 4th column. Two signal lines DSW6_E and DSW2_E are provided on four sense amplifier units SAU in the 10th row and 1st column to the 10th row and 4th column. Two signal lines DSW5_E and DSW1_E are provided on four sense amplifier units SAU in the 11th row and 1st column to the 11th row and 4th column. Two signal lines DSW4_E and DSW0_E are provided on four sense amplifier units SAU in the 12th row and 1st column to the 12th row and 4th column.

In the following descriptions, the signal lines DSWu_v are referred to as signal lines DSW when distinction thereof is not unnecessary. The number of the signal lines DSW is double the number of columns (here, twelve).

Figure 5:
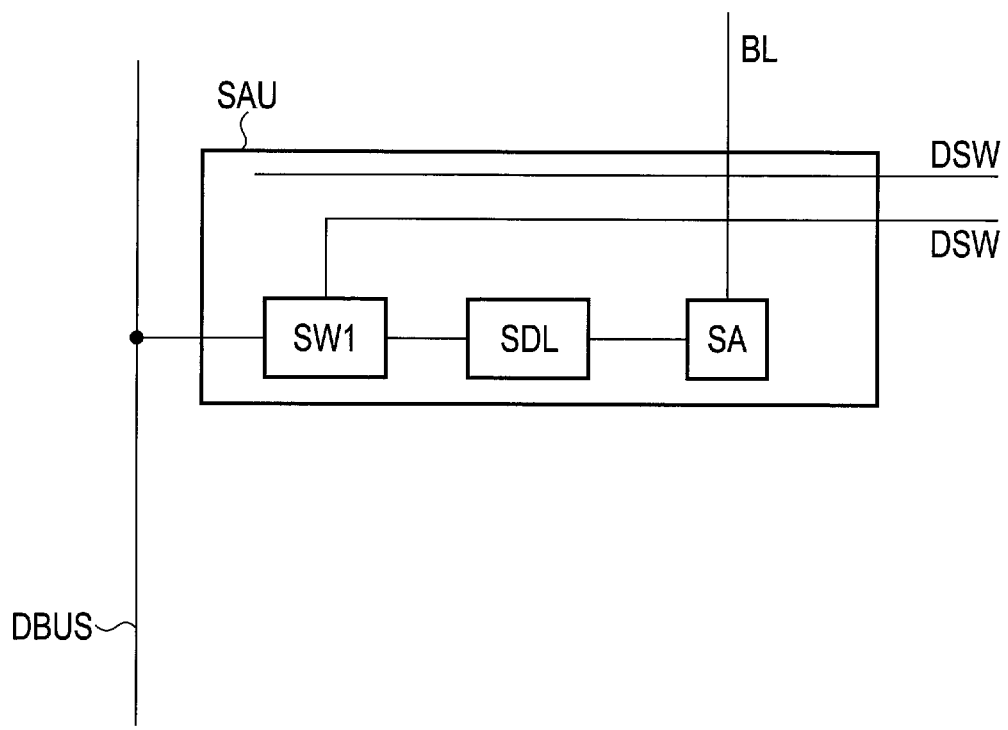
FIG. 5 is a block diagram illustrating a sense amplifier unit.

FIG. 5 is a block diagram illustrating the sense amplifier unit SAU.

The sense amplifier unit SAU includes a sense amplifier circuit SA, a data latch circuit SDL, and a switch SW1 (first switch). In general, the sense amplifier units SAU includes at least one other data latch circuit (not illustrated) other than data latch circuit SDL. The number of the other data latch circuits is, for example, two to five but may exceed five. The sense amplifier circuit SA is connected to a memory cell (not illustrated) via the bit line BL.

The sense amplifier circuit SA is connected to the data bus DBUS via the data latch circuit SDL and the switch SW1. When the switch SW1 is turned on, the sense amplifier circuit SA and the data latch circuit SDL are electrically connected to the data bus DBUS. For example, in FIG. 4, the switches SW1 of three sense amplifier units SAU in the 1st row and 1st column to the 1st row and 3rd column are connected to the signal line DSW7_O, and the switch SW1 of the sense amplifier unit SAU in the 1st row and 4th column is connected to the signal line DSW3_O. Turning on and off the switches SW1 is controlled by a control signal (on signal/off signal) from either of two signal lines DSW provided on the sense amplifier unit SAU. The connection between the switch SW1 and the signal line DSW is represented by a black dot in FIG. 4. For example, in FIG. 4, the switches SW1 of three data latches SDL in the 1st row and 1st column to the 1st row and 3rd column are connected to the signal line DSW7_O. Turning on and off the switches SW1 is controlled by a control signal (on signal/off signal) from the signal line DSW7_O. The control signals supplied to twenty-four signal lines DSW are controlled by the controller 20.

The switch SW1 includes a current path and a control terminal that controls turning on/off the current path. The switch SW1 is, for example, a MOS transistor. In this case, a gate of the MOS transistor is the control terminal, and a path (channel region) between a source and a drain of the MOS transistor is the current path. The source and the drain (or the drain and the source) of the MOS transistor are connected to the data latch circuit SDL and the data bus DBUS, respectively.

Figure 6:
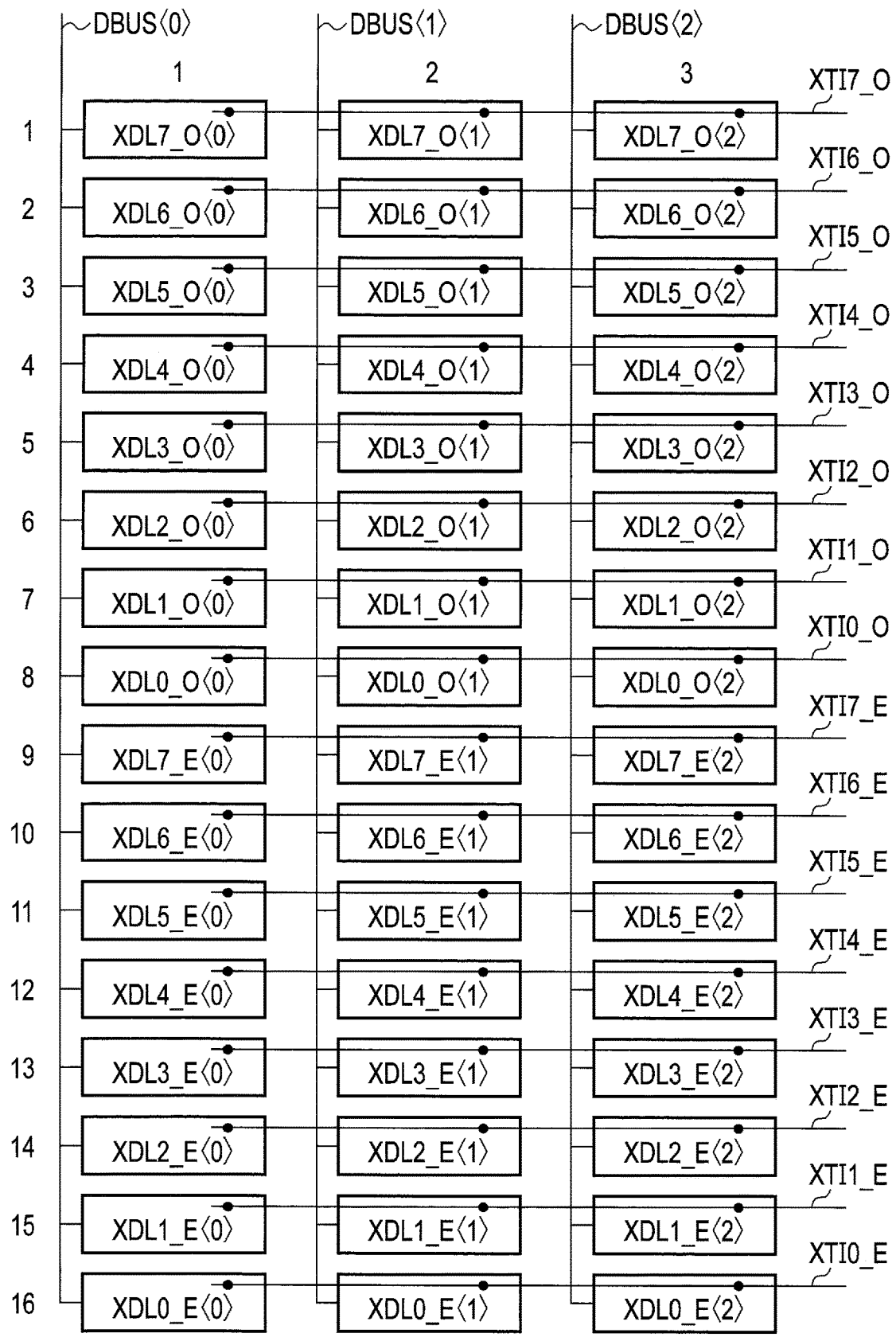
FIG. 6 is a plan view illustrating a plurality of data latches.

As illustrated in FIG. 6, the data cache 15 includes 16×3 (=48) data latches XDLq_r<k> (q is 0 to 7, r is E, O, and r is 0, 1, 2) arranged in a matrix of 16 rows and 3 columns.

As illustrated in FIG. 6, the column numbers of the data latches XDLq_r<k> are 1 to 3 in order from the left side, and the row numbers of the data latches XDLq_r<k> are 1 to 16 in order from the upper side.

The data latches XDLq_r<k> are referred to as data latches XDL when distinction thereof is not unnecessary.

Sixteen data latches XDL7_O<0> to XDL0_E<0> in the 1st row and 1st column to the 16th row and 1st column are connected to the data bus DBUS<0>.

Sixteen data latches XDL7_O<1> to XDL0_E<1> in the 1st row and 2nd column to the 16th row and 2nd column are connected to the data bus DBUS<1>.

Sixteen data latches XDL7_O<2> to XDL0_E<2> in the 1st row and 3rd column to the 16th row and 3rd column are connected to the data bus DBUS<2>.

Sixteen signal lines XTIw_y (w is 0 to 7, and y is 0, E) are provided on 48 data latches XDL. More specifically, the lines XTIw_y are provided in the following manners.

The signal line XTI7_O is provided on three data latches XDL in the 1st row and 1st column to the 1st row and 3rd column. The signal line XTI6_O is provided on three data latches XDL in the 2nd row and 1st column to the 2nd row and 3rd column. The signal line XTI5_O is provided on three data latches XDL in the 3rd row and 1st column to the 3rd row and 3rd column. The signal line XTI4_O is provided on three data latches XDL in the 4th row and 1st column to the 4th row and 3rd column. The signal line XTI3_O is provided on three data latches XDL in the 5th row and 1st column to the 5th row and 3rd column. The signal line XTI2_O is provided on three data latches XDL in the 6th row and 1st column to the 6th row and 3rd column. The signal line XTI1_O is provided on three data latches XDL in the 7th row and 1st column to the 7th row and 3rd column. The signal line XTI0_O is provided on three data latches XDL in the 8th row and 1st column to the 8th row and 3rd column. The signal line XTI7_E is provided on three data latches XDL in the 9th row and 1st column to the 9th row and 3rd column. The signal line XTI6_E is provided on three data latches XDL in the 10th row and 1st column to the 10th row and 3rd column. The signal line XTI5_E is provided on three data latches XDL in the 11th row and 1st column to the 11th row and 3rd column. The signal line XTI4_E is provided on three data latches XDL in the 12th row and 1st column to the 12th row and 3rd column. The signal line XTI3_E is provided on three data latches XDL in the 13th row and 1st column to the 13th row and 3rd column. The signal line XTI2_E is provided on three data latches XDL in the 14th row and 1st column to the 14th row and 3rd column. The signal line XTI1_E is provided on three data latches XDL in the 15th row and 1st column to the 15th row and 3rd column. The signal line XTI0_E is provided on three data latches XDL in the 16th row and 1st column to the 16th row and 3rd column.

In the following descriptions, the signal lines XTIw_y are referred to as signal lines XTI when distinction thereof is not unnecessary.

FIG. 7 is a block diagram illustrating the data latch XDL.

The data latch XDL includes a data latch circuit DL and a switch SW2 (second switch).

The data latch circuit DL is connected to the data bus DBUS via the switch SW2. When the switch SW2 is turned on, the data latch circuit DL is electrically connected to the data bus DBUS. Turning on and off the switches SW2 is controlled by a control signal from the signal line XTI provided on the data latch XDL. The connection between the switch SW2 and the signal line XTI is represented by a black dot in FIG. 6. For example, in FIG. 6, the switches SW2 of three data latches XDL in the 1st row and 1st column to the 1st row and 3rd column are connected to the signal line XTI7_O. Turning on and off the switches SW2 is controlled by a control signal (on signal/off signal) from the signal line XTI7_O. The control signals supplied to twelve control signals XTI are controlled by the controller 20.

The switch SW2 is, for example, a MOS transistor. The gate of the MOS transistor is connected to the signal line XTI. The source and the drain (or the drain and the source) of the MOS transistor are connected to the data latch circuit DL and the data bus DBUS, respectively.

Figure 8:
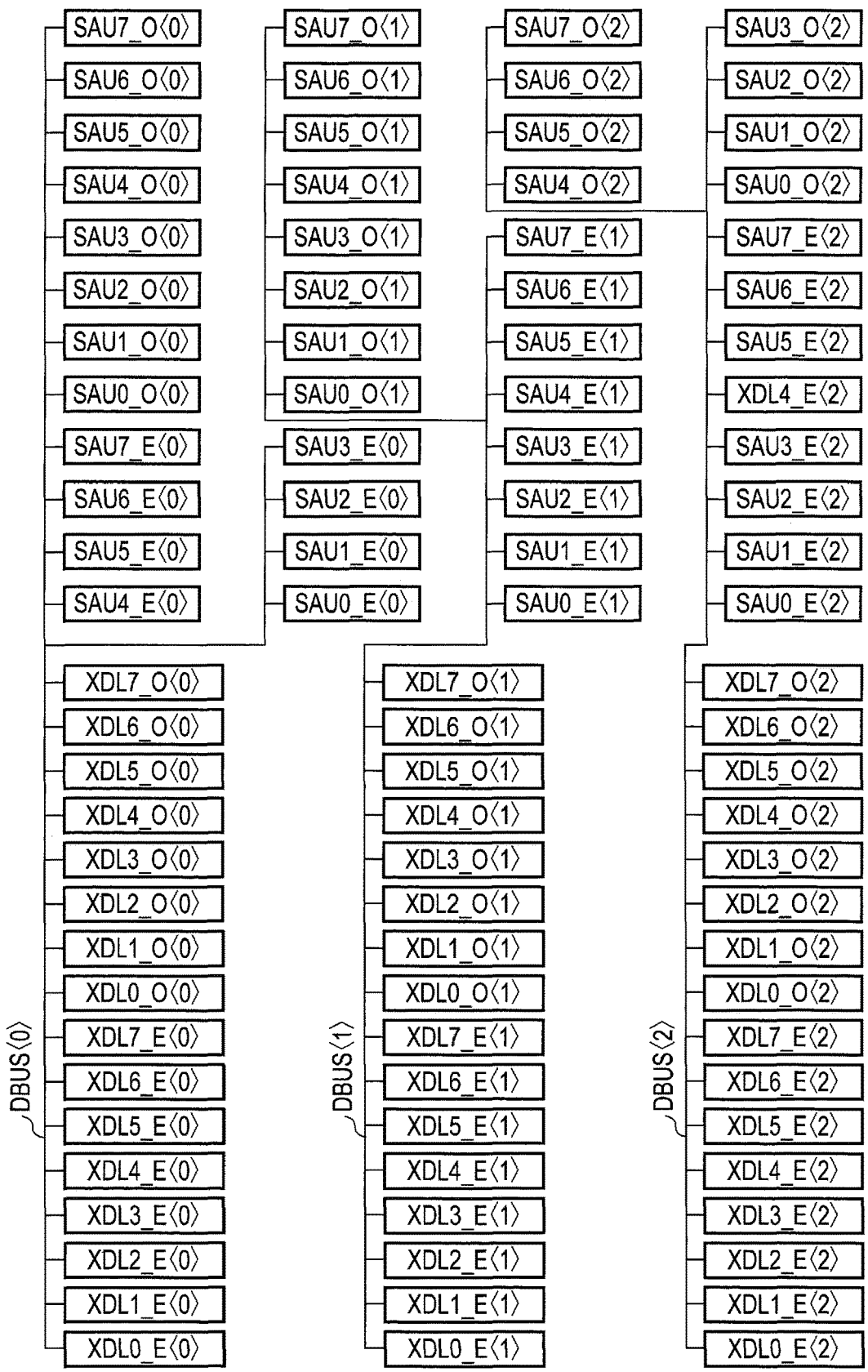
FIG. 8 is a planar layout of a plurality of sense amplifier units and a plurality of data latches of a NAND type flash memory according to a first embodiment.

FIG. 8 is a diagram illustrating a planar layout of 48 sense amplifier units SAU and 48 data latches XDL.

Sixteen sense amplifier units SAU of the first group are connected to sixteen data latches XDL7_O<0> to XDL0_E<0> via the data bus DBUS<0>. Sixteen sense amplifier units SAU of the second group are connected to sixteen data latches XDL7_O<1> to XDL0_E<1> via the data bus DBUS<1>. Sixteen sense amplifier units SAU of the third group are connected to sixteen data latches XDL7_O<2> to XDL0_E<2> via the data bus DBUS<2>.

FIG. 9A is a plan view for explaining dimensions (lengths) of the sense amplifier units SAU and the data latches XDL.

The 48 sense amplifier units SAU arrayed in a matrix of 12 rows and 4 columns have same dimensions in the column direction (column width of the sense amplifier units SAU) L1. The 48 data latches XDL arranged in a matrix of 16 rows and 3 columns have same dimensions in the column direction (column width of the data latch XDL) L2. Here, the number of bit lines is 12×4 (M×N)=48. When a pitch of the bit lines is denoted by P, the dimension L1 corresponds to 12P, and the dimension L2 corresponds to 16P. The dimension L1 is smaller than the dimension L2.

In the present embodiment, a distance L3 in the column direction from the left end of the sense amplifier unit SAU in the first column to the right end of the sense amplifier unit SAU in the fourth column is equal to a distance L3' in the column direction from the left end of the data latch XDL in the first column to the right end of the data latch XDL in the third column. However, the distance L3 and the distance L3' do not need to be equal. For example, the distances L3 and L3' may satisfy $0<|L3-L3'|\le L1$. The number of columns of sense amplifier units SAU is four, and the number of columns of the data latches XDL is three. Therefore, it is possible to achieve a planar layout of the sense amplifier units SAU and the data latches XDL that satisfy L1:L2=3:4.

The 48 sense amplifier units SAU have same dimensions L4 in the row direction. In addition, in the sense amplifier units SAU, a distance between two sense amplifier units SAU adjacent in the column direction (hereinafter referred to as a SAU column interval distance) is zero. In other words, two sense amplifier units SAU adjacent in the column direction are in contact with each other. Setting the SAU column interval distance to zero results in reduction of the area of the sense amplifier portion 14. In addition, in the sense amplifier units SAU, a distance between two sense amplifier units SAU adjacent in the row direction (hereinafter referred to as a SAU row interval distance) is zero. In other words, two sense amplifier units SAU adjacent in the row direction are in contact with each other. Setting the SAU row interval distance to zero results in reduction of the area of the sense amplifier portion 14.

In contrast, the 48 data latches XDL have same dimensions L5 in the row direction. The dimension L5 is smaller than the dimension L4 (L5<L4). In the data latches XDL, a distance between two data latches XDL adjacent in the column direction (hereinafter referred to as XDL column interval distance) is zero. In other words, two data latches XDL adjacent in the column direction are in contact with each other. Setting the XDL column distance to zero results in reduction of the area of the data cache 15. In the data latches XDL, a distance between two data latches XDL adjacent in the row direction (hereinafter referred to as XDL row interval distance) is zero. In other words, two data latches XDL adjacent in the row direction are in contact with each other. Setting the XDL row distance to zero results in reduction of the area of the data cache 15.

Figure 9B:
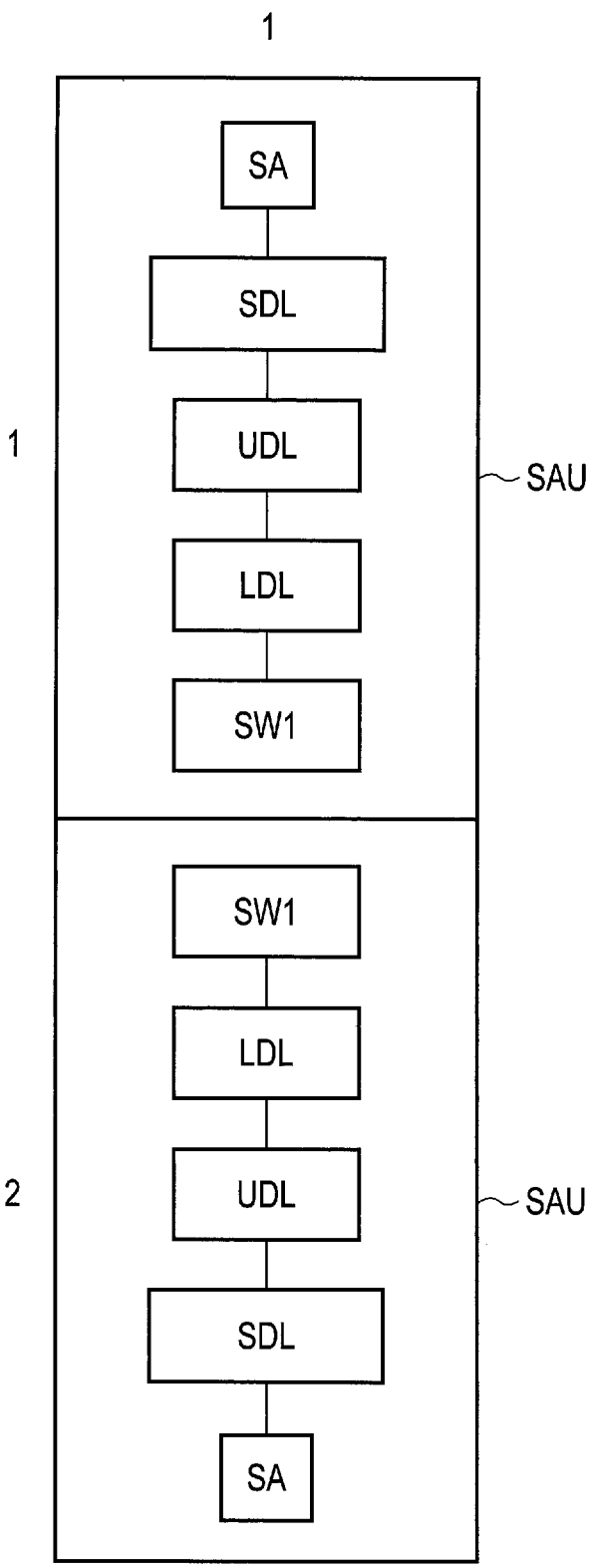
FIG. 9B is a block diagram illustrating two sense amplifier units adjacent in a row direction.
Figure 9C:
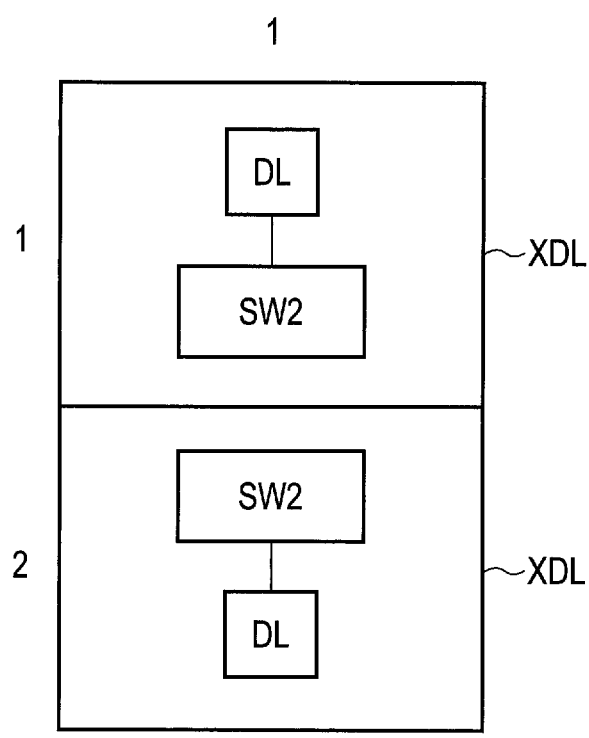
FIG. 9C is a block diagram illustrating two data latches adjacent in a row direction.

Note that, with respect to two sense amplifier units SAU adjacent in the row direction (vertical direction), the order of arrangement of the sense amplifiers, data latch circuits, and switches constituting the sense amplifier units SAU may be opposite. For example, as illustrated in FIG. 9B, the sense amplifier SA, the data latch circuit SDL, a data latch circuit UDL, a data latch circuit LDL, and the switch SW1 are arranged in this order from top to bottom in the sense amplifier unit SAU of the 1st row and 1st column, and the switch SW1, the data latch circuit UDL, the data latch circuit LDL, the data latch circuit SDL, and the sense amplifier SA are arranged in this order from top to down in the sense amplifier unit SAU of the 2nd row and 1st column. The data latch circuit UDL and the data latch circuit LDL are indicative of data latch circuits other than the above-described data latch circuit SDL. Similarly, in two data latches XDL adjacent in the row direction, as illustrated in FIG. 9C, for example, the order of arrangement of the data latch circuit DL and the switch SW2 constituting the data latch XDL may be opposite. The number of the data latch circuit of the data latch XDL is one, but the number of the data latch circuits of the sense amplifier unit SAU may be two or more. As a result, the dimension L4 in the row direction of the sense amplifier unit SAU may be five times or more as large as the dimension L5 in the row direction of the data latch XDL.

In the present embodiment, as described above, the column width (L1) of the sense amplifier unit SAU is set smaller than the column width (L2) of the data latch XDL. The following is the reason why L1<L2 can be applicable in the present embodiment.

The sense amplifier unit SAU mainly operates during a program operation and a read operation. It is enough for the sense amplifier unit SAU to transfer 1/0 data during the program operation and the read operation, and thus the sense amplifier unit SAU can have a relative slow operation guarantee. In contrast, the data latch XDL also operates during an in/out operation of data. During the in/out operation, data needs to be transferred at a higher speed than that during the program operation and read operation, and thus the data latch XDL is required to have a high-speed operation guarantee. That is, a current driving performance of a MOS transistor (first transistor) used in the sense amplifier unit SAU can be lower than a current driving performance of a MOS transistor (second transistor) used in the data latch XDL. For that reason, the sense amplifier unit SAU having necessary performance can be achieved by using a MOS transistor having a smaller size (e.g., at least one of a dimension of channel width, a dimension of gate length and a thickness of gate insulating film) than the second MOS transistor used in the data latch XDL.

Therefore, according to the present embodiment, the column width (L1) of the sense amplifier unit SAU can be made smaller because the transistor constituting the sense amplifier unit SAU can be made smaller without causing degradation in performance during the program operation and the read operation. When the column width (L1) is made smaller, the area of the sense amplifier unit SAU becomes smaller and the increase in chip area of the NAND type flash memory can be thereby suppressed.

For example, when using the sense amplifier units SAU arrayed in a matrix of the 12 rows and 4 columns with L1=12P (embodiment) is compared with using the sense amplifier units SAU arrayed in a matrix of 16 rows and 3 columns with L1=16P (comparative example), the area of the sense amplifier units SAU of the embodiment is ¾ as large as the area of the sense amplifier units SAU of the comparative example. Noted that, L4 of the embodiment is the same as that of the comparative example.

In the present embodiment, L3 is a quadruple of L1, L3' is a treble of L2, and L3=L3', but the dimensions of L1, L2, L3, and L3' can be appropriately varied within a range that the condition L2>L1 is satisfied. For example, when a power line is disposed on the left side of the data latches XDL in the first column and another power line is disposed on the right side of the data latches XDL in the third column in order to assure the high-speed operation of the data latches XDL, the dimension L3' can be made smaller than the dimension L3 by reducing dimension L2 by an amount corresponding to the width of the two power lines as long as the condition L2>L1 is satisfied. In addition, the dimensions of L3 and L3' can be varied as long as 0<|L3−L3'|≤L1 is satisfied.

Next, a method of transferring the data stored in the data latches XDL (DL circuits) to the sense amplifier unites SAU (SDL circuits) will be described. This transferring is executed under control of the controller 20.

First, as to FIG. 8, an example of transferring the data stored in the data latches XDLx_E<k> (x is any one of 0, 1, 2, 3, and k is 0, 1 and 2) respectively to the sense amplifier units SAUx_E<k> (transfer 1) will be described.

In the transfer 1, when x=0, i.e., when the data stored in the data latches XDL0_E<0>, XDL0_E<1>, and XDL0_E<2> are respectively transferred to the sense amplifier units SAU0_E<0>, SAU0_E<1>, and SAU0_E<2>, an on signal is supplied to the signal line XTI0_E and an off signal is supplied to each of remaining fifteen signal lines XTI in FIG. 6, and then, an on signal is supplied to the signal line DSW0_E and an off signal is supplied to each of remaining twenty-three signal lines DSW in FIG. 4.

As a result, the data stored in the data latch XDL0_E<0> is transferred to the sense amplifier unit SAU0_E<0> via the data bus DBUS<0>. The transferred data is latched in the data latch circuit SDL of the sense amplifier unit SAU0_E<0>. Similarly, the data stored in the data latch XDL0_E<1> is transferred to the sense amplifier unit SAU0_E<1> via the data bus DBUS<1>, and the data stored in the data latch XDL0_E<2> is transferred to the sense amplifier unit SAU0_E<2> via the data bus DBUS<2>.

In the transfer 1, when x=1, 2, 3, the transferring is similarly conducted, however the signal lines XTI and DSW will be explained briefly in the following.

In the transfer 1, when x=1, an on signal is supplied to the signal line XTI1_E and an off signal is supplied to each of remaining fifteen signal lines XTI, and then, an on signal is supplied to the signal line DSW1_E and an off signal is supplied to each of remaining twenty-three signal lines DSW.

In the transfer 1, when x=2, an on signal is supplied to the signal line XTI2_E and an off signal is supplied to each of remaining fifteen signal lines XTI, and then, an on signal is supplied to the signal line DSW2_E and an off signal is supplied to each of remaining twenty-three signal lines DSW.

In the transfer 1, when x=3, an on signal is supplied to the signal line XTI3_E and an off signal is supplied to each of remaining fifteen signal lines XTI, and then, an on signal is supplied to the signal line DSW3_E and an off signal is supplied to each of remaining twenty-three signal lines DSW.

Next, as to FIG. 8, an example of transferring the data stored in the data latches XDLx_E<k> (x is any one of 4, 5, 6, 7, and k is 0, 1 and 2) respectively to the sense amplifier units SAUx_E<k> (transfer 2) will be described.

In the transfer 2, when x=4, i.e., when the data stored in the data latches XDL4_E<0>, XDL4_E<1>, and XDL4_E<2> are respectively transferred to the sense amplifier units SAU4_E<0>, SAU4_E<1>, and SAU4_E<2>, an on signal is supplied to the signal line XTI4_E and an off signal is supplied to each of remaining fifteen signal lines XTI in FIG. 6, and then, an on signal is supplied to the signal line DSW4_E and an off signal is supplied to each of remaining twenty-two signal lines DSW in FIG. 4.

As a result, the data stored in the data latch XDL4_E<0> is transferred to the sense amplifier unit SAU4_E<0> via the data bus DBUS<0>. The transferred data is latched in the data latch circuit SDL of the sense amplifier unit SAU4_E<0>. Similarly, the data stored in the data latch XDL4_E<1> is transferred to the sense amplifier unit SAU4_E<1> via the data bus DBUS<1>, and the data stored in the data latch XDL4_E<2> is transferred to the sense amplifier unit SAU4_E<2> via the data bus DBUS<2>.

In the transfer 2, when x=5, 6, 7, the transferring is similarly conducted, however the signal lines XTI and DSW will be explained briefly in the following.

In the transfer 2, when x=5, an on signal is supplied to the signal line XTI5_E and an off signal is supplied to each of remaining fifteen signal lines XTI, and then, an on signal is supplied to 2 signal lines DSW5_E and an off signal is supplied to each of remaining twenty-two signal lines DSW.

In the transfer 2, when x=6, an on signal is supplied to the signal line XTI6_E and an off signal is supplied to each of remaining fifteen signal lines XTI, and then, an on signal is supplied to two signal lines DSW6_E and an off signal is supplied to each of remaining twenty-two signal lines DSW.

In the transfer 2, when x=7, an on signal is supplied to the signal line XTI7_E and an off signal is supplied to each of remaining fifteen signal lines XTI, and then, an on signal is supplied to two signal lines DSW7_E and an off signal is supplied to each of remaining twenty-two signal lines DSW.

Next, as to FIG. 8, an example of transferring the data stored in the data latches XDLx_O<k>, XDLx_O<k>, and XDLx_O<k> (x is any one of 0, 1, 2, 3, and k is 0, 1 and 2) respectively to the sense amplifier units SAUx_E<0>, SAUx_O<1>, and SAUx_O<2> (transfer 3) will be described.

In the transfer 3, when x=0, i.e., when the data stored in the data latches XDL0_O<0>, XDL0_O<1>, and XDL0_O<2> are respectively transferred to the sense amplifier units SAU0_O<0>, SAU0_O<1>, and SAU0_O<2>, an on signal is supplied to the signal line XTI0_O and an off signal is supplied to each of remaining fifteen signal lines XTI in FIG. 6, and then, an on signal is supplied to two signal lines DSW0_O and an off signal is supplied to each of remaining twenty-two signal lines DSW in FIG. 4.

As a result, the data stored in the data latch XDL0_O<0> is transferred to the sense amplifier unit SAU0_O<0> via the data bus DBUS<0>. The transferred data is latched in the data latch circuit SDL of the sense amplifier unit SAU0_O<0>. Similarly, the data stored in the data latch XDL0_O<1> is transferred to the sense amplifier unit SAU0_O<1> via the data bus DBUS<1>, and the data stored in the data latch XDL0_O<2> is transferred to the sense amplifier unit SAU0_O<2> via the data bus DBUS<2>.

In the transfer 3, when x=1, 2, 3, the transferring is similarly conducted, however the signal lines XTI and DSW will be explained briefly in the following.

In the transfer 3, when x=1, an on signal is supplied to the signal line XTI1_O and an off signal is supplied to each of remaining fifteen signal lines XTI, and then, an on signal is supplied to two signal lines DSW1_O and an off signal is supplied to each of remaining twenty-two signal lines DSW.

In the transfer 3, when x=2, an on signal is supplied to the signal line XTI2_O and an off signal is supplied to each of remaining fifteen signal lines XTI, and then, an on signal is supplied to two signal lines DSW2_O and an off signal is supplied to each of remaining twenty-two signal lines DSW.

In the transfer 3, when x=3, an on signal is supplied to the signal line XTI3_O and an off signal is supplied to each of remaining fifteen signal lines XTI, and then, an on signal is supplied to two signal lines DSW3_O and an off signal is supplied to each of remaining twenty-two signal lines DSW.

Next, as to FIG. 8, an example of transferring the data stored in the data latches XDLx_O<k> (x is any one of 4, 5, 6, 7, and k is 0, 1 and 2) respectively to the sense amplifier units SAUx_O<k> (transfer 4) will be described.

In the transfer 4, when x=4, i.e., when the data stored in the data latches XDL4_O<0>, XDL4_O<1>, and XDL4_O<2> are respectively transferred to the sense amplifier units SAU4_O<0>, SAU4_O<1>, and SAU4_O<2>, an on signal is supplied to the signal line XTI4_O and an off signal is supplied to each of remaining fifteen signal lines XTI in FIG. 6, and then, an on signal is supplied to the signal line DSW4_O and an off signal is supplied to each of remaining twenty-three signal lines DSW in FIG. 4.

As a result, the data stored in the data latch XDL4_O<0> is transferred to the sense amplifier unit SAU4_O<0> via the data bus DBUS<0>. The transferred data is latched in the data latch circuit SDL of the sense amplifier unit SAU4_O<0>. Similarly, the data stored in the data latch XDL4_O<1> is transferred to the sense amplifier unit SAU4_O<1> via the data bus DBUS<1>, and the data stored in the data latch XDL4_O<2> is transferred to the sense amplifier unit SAU4_O<2> via the data bus DBUS<2>.

In the transfer 4, when x=5, 6, 7, the transferring is similarly conducted, however the signal lines XTI and DSW will be explained briefly in the following.

In the transfer 4, when x=5, an on signal is supplied to the signal line XTI5_O and an off signal is supplied to each of remaining fifteen signal lines XTI, and then, an on signal is supplied to the signal line DSW5_O and an off signal is supplied to each of remaining twenty-three signal lines DSW.

In the transfer 4, when x=6, an on signal is supplied to the signal line XTI6_O and an off signal is supplied to each of remaining fifteen signal lines XTI, and then, an on signal is supplied to the signal line DSW6_O and an off signal is supplied to each of remaining twenty-three signal lines DSW.

In the transfer 4, when x=7, an on signal is supplied to the signal line XTI7_O and an off signal is supplied to each of remaining fifteen signal lines XII, and then, an on signal is supplied to the signal line DSW7_O and an off signal is supplied to each of remaining twenty-three signal lines DSW.

Next, an operation of transferring the data stored in the sense amplifier unit SAU (i.e., data latch circuit SDL) to the data latch XDL (i.e., DL circuit) will be described. This operation is executed under control of the controller 20.

First, an example of transferring the data stored in the sense amplifier units SAUx_E<k> (x is any one of 0, 1, 2, 3, and k is 0, 1 and 2) respectively to the data latches XDLx_E<k> (transfer 5) will be described.

In the transfer 5, when x=0, i.e., when the data stored in the sense amplifier units SAU0_E<0>, SAU0_E≤1>, and SAU0_E<2> are respectively transferred to the data latches XDL0_E<0>, XDL0_E<1>, and XDL0_E≤2>, an on signal is supplied to the signal line DSW0_E and an off signal is supplied to each of remaining twenty-three signal lines DSW in FIG. 4, and then, an on signal is supplied to the signal line XTI0_E and an off signal is supplied to each of remaining fifteen signal lines XTI in FIG. 6.

As a result, the data stored in the sense amplifier unit SAU0_E<0> is transferred to the data latch XDL0_E<0> via the data bus DBUS<0>. Similarly, the data stored in the sense amplifier unit SAU0_E<1> is transferred to the data latch XDL0_E<1> via the data bus DBUS<1>, and the data stored in the sense amplifier unit SAU0_E<1> is transferred to the data latch XDL0_E≤2> via the data bus DBUS<2>.

In the transfer 5, when x=1, 2, 3, the transferring is similarly conducted, however the signal lines XTI and DSW will be explained briefly in the following.

In the transfer 5, when x=1, an on signal is supplied to the signal line DSW1_E and an off signal is supplied to each of remaining twenty-three signal lines DSW, and then, an on signal is supplied to the signal line XTI1_E and an off signal is supplied to each of remaining fifteen signal lines XTI.

In the transfer 5, when x=2, an on signal is supplied to the signal line DSW2_E and an off signal is supplied to each of remaining twenty-three signal lines DSW, and then, an on signal is supplied to the signal line XTI2_E and an off signal is supplied to each of remaining fifteen signal lines XTI.

In the transfer 5, when x=3, an on signal is supplied to the signal line DSW3_E and an off signal is supplied to each of remaining twenty-three signal lines DSW, and then, an on signal is supplied to the signal line XTI3_E and an off signal is supplied to each of remaining fifteen signal lines XTI.

Next, as to FIG. 8, an example of transferring the data stored in the sense amplifier units SAUx_E<k> (x is any one of 4, 5, 6, 7, and k is 0, 1 and 2) respectively to the data latches XDLx_E<k> (transfer 6) will be described.

In the transfer 6, when x=4, i.e., when the data stored in the sense amplifier units SAU4_E<0>, SAU4_E<1>, and SAU4_E<2> are respectively transferred to the data latches XDL4_E<0>, XDL4_E<1>, and XDL4_E<2>, an on signal is supplied to two signal lines DSW4_E and an off signal is supplied to each of remaining twenty-two signal lines DSW in FIG. 4, and then, an on signal is supplied to the signal line XTI4_E and an off signal is supplied to each of remaining fifteen signal lines XTI in FIG. 6.

As a result, the data stored in the sense amplifier unit SAU4_E<0> is transferred to the data latch XDL4_E<0> via the data bus DBUS<0>. Similarly, the data stored in the sense amplifier unit SAU4_E<1> is transferred to the data latch XDL4_E<1> via the data bus DBUS<1>, and the data stored in the sense amplifier unit SAU4_E<2> is transferred to the data latch XDL4_E<2> via the data bus DBUS<2>.

In the transfer 6, when x=5, 6, 7, the transferring is similarly conducted, however the signal lines XTI and DSW will be explained briefly in the following.

In the transfer 6, when x=5, an on signal is supplied to two signal lines DSW5_E and an off signal is supplied to each of remaining twenty-two signal lines DSW, and then, an on signal is supplied to the signal line XTI5_E and an off signal is supplied to each of remaining fifteen signal lines XTI.

In the transfer 6, when x=6, an on signal is supplied to two signal lines DSW6_E and an off signal is supplied to each of remaining twenty-two signal lines DSW, and then, an on signal is supplied to the signal line XTI6_E and an off signal is supplied to each of remaining fifteen signal lines XTI.

In the transfer 6, when x=7, an on signal is supplied to two signal lines DSW7_E and an off signal is supplied to each of remaining twenty-two signal lines DSW, and then, an on signal is supplied to the signal line XTI7_E and an off signal is supplied to each of remaining fifteen signal lines XTI.

Next, an example of transferring the data stored in the sense amplifier units SAUx_O<k> (x is any one of 0, 1, 2, 3, and k is 0, 1 and 2) respectively to the data latches XDLx_O<k> (transfer 7) will be described.

In the transfer 7, when x=0, i.e., when the data stored in the sense amplifier units SAU0_O<0>, SAU0_O<1>, and SAU0_O<2> are respectively transferred to the data latches XDL0_O<0>, XDL0_O<1>, and XDL0_O<2>, an on signal is supplied to two signal lines DSW0_O and an off signal is supplied to each of remaining twenty-two signal lines DSW, and then, an on signal is supplied to the signal line XTI0_O and an off signal is supplied to each of remaining fifteen signal lines XTI.

As a result, the data stored in the sense amplifier unit SAU0_O<0> is transferred to the data latch XDL0_O<0> via the data bus DBUS<0>. Similarly, the data stored in the sense amplifier unit SAU0_O<1> is transferred to the data latch XDL0_O<1> via the data bus DBUS<1>, and the data stored in the sense amplifier unit SAU0_O<2> is transferred to the data latch XDL0_O<2> via the data bus DBUS<2>.

In the transfer 7, when x=1, 2, 3, the transferring is similarly conducted, however the signal lines XTI and DSW will be explained briefly in the following.

In the transfer 7, when x=1, an on signal is supplied to two signal lines DSW1_O and an off signal is supplied to each of remaining twenty-two signal lines DSW, and then, an on signal is supplied to the signal line XTI1_O and an off signal is supplied to each of remaining fifteen signal lines XTI.

In the transfer 7, when x=2, an on signal is supplied to two signal lines DSW2_O and an off signal is supplied to each of remaining twenty-two signal lines DSW, and then, an on signal is supplied to the signal line XTI2_O and an off signal is supplied to each of remaining fifteen signal lines XTI.

In the transfer 7, when x=3, an on signal is supplied to two signal lines DSW3_O and an off signal is supplied to each of remaining twenty-two signal lines DSW, and then, an on signal is supplied to the signal line XTI3_O and an off signal is supplied to each of remaining fifteen signal lines XTI.

Next, an example of transferring the data stored in the sense amplifier units SAUx_O<k> (x is any one of 4, 5, 6, 7, and k is 0, 1 and 2) respectively to the data latches XDLx_O<k> (transfer 8) will be described.

In the transfer 8, when x=4, i.e., when the data stored in the sense amplifier units SAU4_O<0>, SAU4_O<1>, and SAU4_O<2> are respectively transferred to the data latches XDL4_O<0>, XDL4_O<1>, and XDL4_O<2>, an on signal is supplied to the signal line DSW4_O and an off signal is supplied to each of remaining twenty-three signal lines DSW, and then, an on signal is supplied to the signal line XTI4_O and an off signal is supplied to each of remaining fifteen signal lines XTI.

As a result, the data stored in the sense amplifier unit SAU4_O<0> is transferred to the data latch XDL4_O<0> via the data bus DBUS<0>. Similarly, the data stored in the sense amplifier unit SAU4_O<1> is transferred to the data latch XDL4_O<1> via the data bus DBUS<1>, and the data stored in the sense amplifier unit SAU4_O<2> is transferred to the data latch XDL4_O<2> via the data bus DBUS<2>.

In the transfer 8, when x=5, 6, 7, the transferring is similarly conducted, however the signal lines XTI and DSW will be explained briefly in the following.

In the transfer 8, when x=5, an on signal is supplied to the signal line DSW5_O and an off signal is supplied to each of remaining twenty-three signal lines DSW, and then, an on signal is supplied to the signal line XTI5_O and an off signal is supplied to each of remaining fifteen signal lines XTI.

In the transfer 8, when x=6, an on signal is supplied to the signal line DSW6_O and an off signal is supplied to each of remaining twenty-three signal lines DSW, and then, an on signal is supplied to the signal line XTI6_O and an off signal is supplied to each of remaining fifteen signal lines XTI.

In the transfer 8, when x=7, an on signal is supplied to the signal line DSW7_O and an off signal is supplied to each of remaining twenty-three signal lines DSW, and then, an on signal is supplied to the signal line XTI7_O and an off signal is supplied to each of remaining fifteen signal lines XTI.

Second Embodiment

FIG. 10 is a diagram illustrating a planar layout of a plurality of sense amplifier units SAU and a plurality of data latches XDL of a NAND type flash memory according to the second embodiment.

The present embodiment is different from the first embodiment in that two data buses DBUS<0>, two data buses DBUS<1>, and two data buses DBUS<2> are used.

When the two data buses DBUS<0> are distinguished, they are referred to as data bus DBUS_E<0> and data bus DBUS_O<0>. When the two data buses DBUS<1> are distinguished, they are referred to as data bus DBUS_E<1> and data bus DBUS_O<1>. When the two data buses DBUS<2> are distinguished, they are referred to as data bus DBUS_E<2> and DBUS_O<2>.

In sense amplifier units SAU of the first group, the sense amplifier units SAUi_E<0> (i is 0, 1, . . . , 7) and the data latches XDLi_E<0> are connected by using the data bus DBUS_E<0>. The sense amplifier units SAUi_O<0> and the data latches XDLi_O<0> are connected by using the data bus DBUS_O<0>. In the sense amplifier units SAU of the first group, the data bus DBUS_O<0> is provided on a layer, which is, for example, higher or lower than the data bus DBUS_E<0>. Alternatively, the data bus DBUS_O<0> and the DBUS_E<0> may be provided on the same layer.

In sense amplifier units SAU of the second group, the sense amplifier units SAUi_E<1> (i is 0, 1, . . . , 7) and the data latches XDLi_E<1> are connected by using the data bus DBUS_E<1>. In the sense amplifier units SAU of the second group, the sense amplifier units SAUi_O<1> and the data latches XDLi_O<1> are connected by using the data bus DBUS_O<1>. The data bus DBUS_O<1> is provided on a layer, which is, for example, higher or lower than the data bus DBUS_E<1>. Alternatively, the data bus DBUS_O<1> and the DBUS_E<1> may be provided on a same layer.

In sense amplifier units SAU of the third group, the sense amplifier units SAUi_E<2> (i is 0, 1, . . . , 7) and the data latches XDLi_E<2> are connected by using the data bus DBUS_E<2>. In the sense amplifier units SAU of the third group, the sense amplifier units SAUi_O<2> and the data latches XDLi_O<2> are connected by using the data bus DBUS_O<2>. The data bus DBUS_O<2> is provided on a layer, which is, for example, higher or lower than the data bus DBUS_E<2>. Alternatively, the data bus DBUS_O<2> and the DBUS_E<2> may be provided on a same layer.

In the present embodiment, data transfer between the sense amplifier units SAUi_E<0> (i is 0, 1, . . . , 7) and the data latches XDLi_E≤0>, and data transfer between the sense amplifier units SAUi_O<0> and the data latches XDThi_O<0> can be executed simultaneously because the two data buses DBUS_E<0> and DBUS_O<0> are used. As a result, the time for the data transfer between the sense amplifier units SAUi_j<0> (i is 0, 1, . . . , 7, and j is E, O) and the data latches XDLi_j<0> using two data buses DBUS_E<0> and DBUS_O<0> is a half of that using one data bus DBUS<0>. Similarly, the time for the data transfer between the sense amplifier units SAUi_j<1> and the data latches XDLi_j<1>, and the time for the data transfer between the sense amplifier units SAUi_j<2> and the data latches XDLi_j<2> are also reduced to half.

Next, an example of transferring the data stored in two data latches XDL to two sense amplifier units SAU which corresponding thereto will be described.

For example, when the data stored in the data latches XDL0_E<0> and XDL0_O<0> are respectively transferred to the sense amplifier units SAU0_E<0> and SAUD_O<0>, an on signal is supplied to the signal lines XTI0_E and XTI0_O and an off signal is supplied to each of the other signal lines XTI in FIG. 6, and then, an on signal is supplied to the signal lines DSW0_E and DSW0_O and an off signal is supplied to each of the other signal lines DSW in FIG. 4.

As a result, the data stored in the data latch XDL0_E<0> is transferred to the sense amplifier unit SAU0_E<0> via the data bus DBUS_E<0>, and the data stored in the data latch XDL0_O<0> is transferred to the sense amplifier unit SAU0_O<0> via the data bus DBUS_O<0>.

In general, when the data stored in the data latches XDLi_E<k> and XDLi_O<k> (i is 0, 1, . . . , 7, and k is 0, 1, 2) are transferred to the sense amplifier units SAUi_E<0> and SAUi_O<k> corresponding thereto, an on signal is supplied to the signal lines XTIi_E and XTIi_O and an off signal is supplied to each of the other signal lines XTI, and then, an on signal is supplied to the signal lines DSWi_E and DSWi_O and an off signal is supplied to each of the other signal lines DSW.

In contrast, when the data stored in the sense amplifier units SAUi_E<k> and SAUi_O<k> are transferred to the data latches XDLi_E<k> and XDLi_O<k> (i is 0, 1, . . . , 7, and k is 0, 1, 2) corresponding thereto, an on signal is supplied to the signal lines DSWi_E and DSWi_O and an off signal is supplied to each of the other signal lines DSW, and then, an on signal is supplied to the signal lines XTIi_E and XTIi_O and an off signal is supplied to each of the other signal lines XTI.

Third Embodiment

Figure 11:
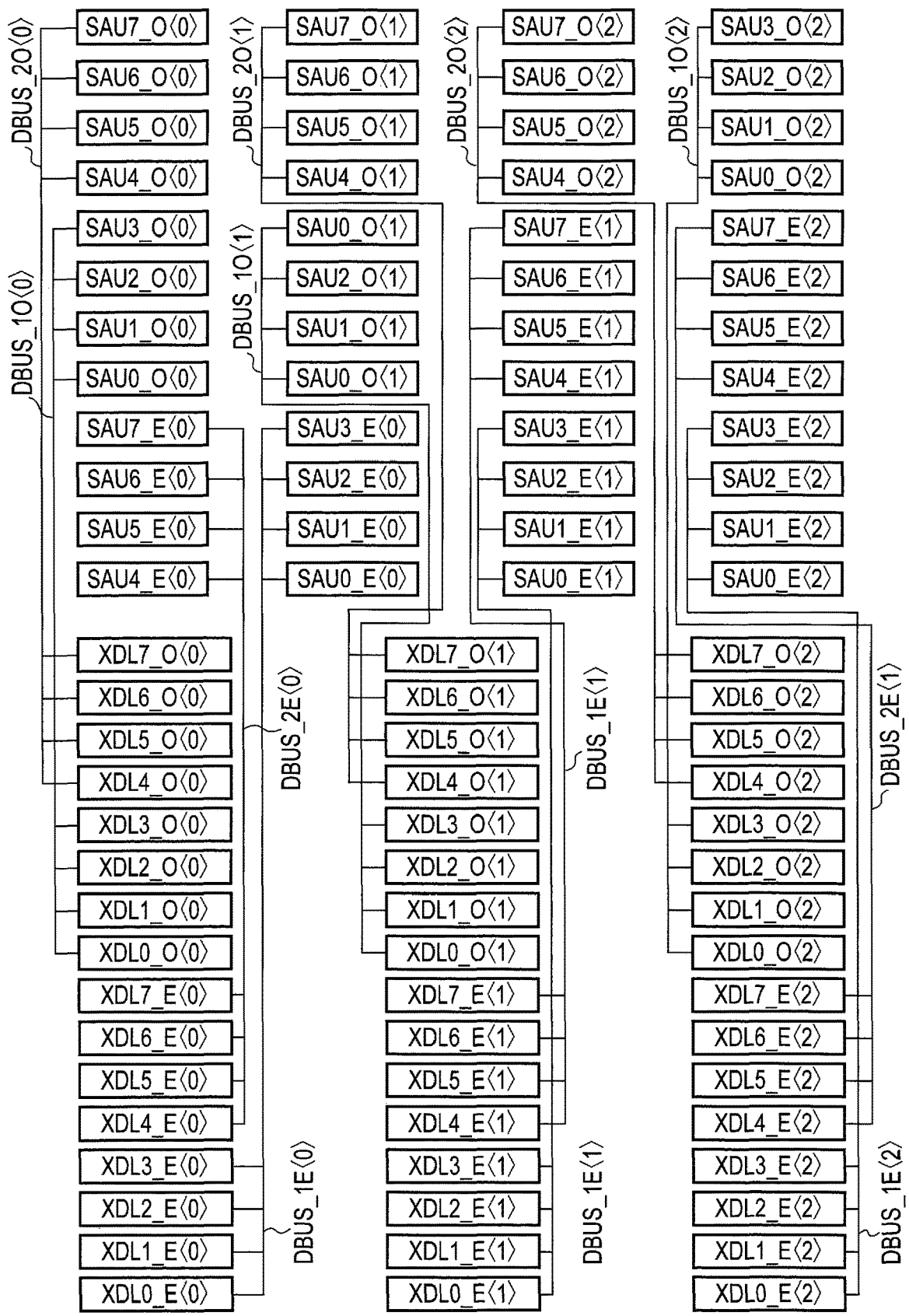
FIG. 11 is a diagram illustrating a planar layout of a plurality of sense amplifier units and a plurality of data latches of a NAND type flash memory according to a third embodiment.

FIG. 11 is a diagram illustrating a planar layout of a plurality of sense amplifier units SAU and a plurality of data latches XDL of a NAND type flash memory according to the third embodiment.

The present embodiment is different from the first embodiment in that four data buses DBUS<0>, four data buses DBUS<1>, and four data buses DBUS<2> are used.

When four data buses DBUS<0> are distinguished, they are referred to as data bus DBUS_1E<0>, data bus DBUS_2E<0>, data bus DBUS_1O<0>, and data bus DBUS_2O<0>. When four data buses DBUS<1> are distinguished, they are referred to as data bus DBUS_1E<1>, data bus DBUS_2E<1>, data bus DBUS_1O<1>, and data bus DBUS_2O<1>. When four data buses DBUS<2> are distinguished, they are referred to as data bus DBUS_1E<2>, data bus DBUS_2E<2>, data bus DBUS_1O<2>, and data bus DBUS_2O<2>.

In sense amplifier units SAU of the first group, the sense amplifier units SAUi_E<0> (i is 0, 1, 2, 3) and the data latches XDLi_E<0> (i is 0, 1, 2, 3) are connected by using the data bus DBUS_1E<0>. In the sense amplifier units SAU of the first group, the sense amplifier units SAUi_E<0> (i is 4, 5, 6, 7) and the data latches XDLi_E<0> (i is 4, 5, 6, 7) are connected by using the data bus DBUS_2E<0>. In the sense amplifier units SAU of the first group, the sense amplifier units SAUi_O<0> (i is 0, 1, 2, 3) and the data latches XDLi_O<0> (i is 0, 1, 2, 3) are connected by using the data bus DBUS_1O<0>. In the sense amplifier units SAU of the first group, the sense amplifier units SAUi_O<0> (i is 4, 5, 6, 7) and the data latches XDLi_O<0> (i is 4, 5, 6, 7) are connected by using the data bus DBUS_2O<0>. For example, the data buses DBUS_2O<0> is provided in a layer higher (or lower) than the data bus DBUS_1O<0>, and the data bus DBUS_2E<0> and the data bus DBUS_1E<0> are provided in a same layer. Note that, a vertical positional relation (higher, lower, same) of four regions on which the four data buses are respectively provided is appropriately determined.

In sense amplifier units SAU of the second group, the sense amplifier units SAUi_E<1> (i is 0, 1, 2, 3) and the data latches XDLi_E<1> (i is 0, 1, 2, 3) are connected by using the data bus DBUS_1E<1>. In the sense amplifier units SAU of the second group, the sense amplifier units SAUi_E<1> (i is 4, 5, 6, 7) and the data latches XDLi_E<1> (i is 4, 5, 6, 7) are connected by using the data bus DBUS_2E<1>. In the sense amplifier units SAU of the second group, the sense amplifier units SAUi_O<1> (i is 0, 1, 2, 3) and the data latches XDLi_O<1> (i is 0, 1, 2, 3) are connected by using the data bus DBUS_1O<1>. In the sense amplifier units SAU of the second group, the sense amplifier units SAUi_O<1> (i is 4, 5, 6, 7) and the data latches XDLi_O<1> (i is 4, 5, 6, 7) are connected by using the data bus DBUS_2O<1>. For example, the data buses DBUS_2E<1> is provided in a layer higher than the DBUS_1E<1>, and the DBUS_2O<1> is provided in a layer higher (or lower) than the data bus DBUS_1O<1>. Note that, a vertical positional relation (higher, lower, same) of four regions on which the four data buses are respectively provided is appropriately determined.

In sense amplifier units SAU of the third group, the sense amplifier units SAUi_E<2> (i is 0, 1, 2, 3) and the data latches XDLi_E<2> (i is 0, 1, 2, 3) are connected by using the data bus DBUS_1E<2>. In the sense amplifier units SAU of the third group, the sense amplifier units SAUi_E<2> (i is 4, 5, 6, 7) and the data latches XDLi_E<2> (i is 4, 5, 6, 7) are connected by using the data bus DBUS_2E<2>. In the sense amplifier units SAU of the third group, the sense amplifier units SAUi_O<2> (i is 0, 1, 2, 3) and the data latches XDLi_O<2> (i is 0, 1, 2, 3) are connected by using the data bus DBUS_1O<2>. In the sense amplifier units SAU of the third group, the sense amplifier units SAUi_O<2> (i is 4, 5, 6, 7) and the data latches XDLi_O<2> (i is 4, 5, 6, 7) are connected by using the data bus DBUS_2O<2>. For example, the data buses DBUS_2E<2> is provided in a layer higher than the DBUS_1E<2>, and the DBUS_2O<2> is provided in a layer higher (or lower) layer than the data bus DBUS_1O<2>. Note that, a vertical positional relation (higher, lower, same) of four regions on which the four data buses are respectively provided is appropriately determined.

In the present embodiment, the data transfer between the sense amplifier units SAUi_E<0> (i is 0, 1, 2, 3) and the data latches XDLi_E<0> (i is 0, 1, 2, 3), the data transfer between the sense amplifier units SAUi_E<0> (i is 4, 5, 6, 7) and the data latches XDLi_E<0> (i is 4, 5, 6, 7), the data transfer between the sense amplifier units SAUi_O<0> (i is 0, 1, 2, 3) and the data latches XDLi_O<0> (i is 0, 1, 2, 3), and the data transfer between the sense amplifier units SAUi_O<0> (i is 4, 5, 6, 7) and the data latches XDLi_O<0> (i is 4, 5, 6, 7), can be executed simultaneously by using four data buses DBUS_1E<0>, DEUS_2E<0>, DBUS_1O<0>, and DBUS_2O<0>. As a result, the time for the data transfer between the sense amplifier units SAUi_j<0> (i is 0, 1, . . . , 7, and j is E, O) and the data latches XDLi_j<0> using four data buses DBUS_1E<0>, DBUS_2E<0>, DBUS_1O<0>, and DBUS_2O<0> is a quarter of that using one data bus DBUS<0>. Similarly, the time for the data transfer between the sense amplifier units SAUi_j<1> and the data latches XDLi_j<0>, and the time for the data transfer between the sense amplifier units SAUi_j<2> and the data latches XDLi_j<2> are also reduced to quarter.

Next, an example of transferring the data stored in four data latches XDL to four sense amplifier units SAU corresponding thereto will be described.

For example, when the data stored in the data latches XDL0_E<0>, XDL4_E<0>, XDL0_O<0>, and XDL0_4<0> are respectively transferred to the sense amplifier units SAU0_E<0>, SAU4_E<0>, SAU0_O<0>, and SAU4_O <0>, an on signal is supplied to the signal lines XTI0_E, XTI4_E, XTI0_O, and XTI4_O and an off signal is supplied to each of the other signal lines XTI in FIG. 6, and then, an on signal is supplied to the signal lines DSW0_E, DSW4_E, DSW0_O, and DSW4_O and an off signal is supplied to each of the other signal lines DSW in FIG. 4.

As a result, the data stored in the data latch XDL0_E<0> is transferred to the sense amplifier unit SAU0_E<0> via the data bus DBUS_1E<0>, the data stored in the data latch XDL4_E<0> is transferred to the sense amplifier unit SAU4_E<0> via the data bus DBUS_2E<0>, the data stored in the data latch XDL0_O<0> is transferred to the sense amplifier unit SAU0_O<0> via the data bus DBUS_1O<0>, and the data stored in the data latch XDL4_O<0> is transferred to the sense amplifier unit SAU4_O<0> via the data bus DBUS_2O<0>.

In general, when the data stored in the data latches XDLi_E<k> (i is 0, 1, 2, 3, and k is 0, 1, 2), XDL(i+4)_E<k>, XDLi_O<k>, and XDL(i+4)_O<k> are respectively transferred to the sense amplifier units SAUi_E<k>, SAU(i+4)_E<k>, SAUi_O<k>, and SAU(i+4)_O<k>, an on signal is supplied to the signal lines XTIi_E, XTI(i+4)_E, XIIi_O, and XTI(i+4)_O and an off signal is supplied to each of the other signal lines. XTI, and then, an on signal is supplied to the signal lines DSWi_E, DSW(i+4)_E, DSWi_O, and DSW(i+4)_O and an off signal is supplied to each of the other signal lines DSW.

In contrast, when the data stored in the sense amplifier units SAUi_E<k>, SAU(i+4)_E<k>, SAUi_O<k>, and SAU(i+4)_O<k> (i is 0, 1, 2, 3, and k is 0, 1, 2) are respectively transferred to the data latches XDLi_E<k> (i is 0, 1, 2, 3 and k is 0, 1, 2), XDL(i+4)_E<k>, XDLi_O<k>, and XDL(i+4)_O<k>, an on signal is supplied to the signal lines DSWi_E, DSW(i+4)_E, DSWi_O, and DSW(i+4)_O and an off signal is supplied to each of the other signal lines DSW, and then, an on signal is supplied to the signal lines XTIi_E, XTI(i+4)_E, XTIi_O, and XTI(i+4)_O and an off signal is supplied to each of the other signal lines XTI.

Fourth Embodiment

Figure 13:
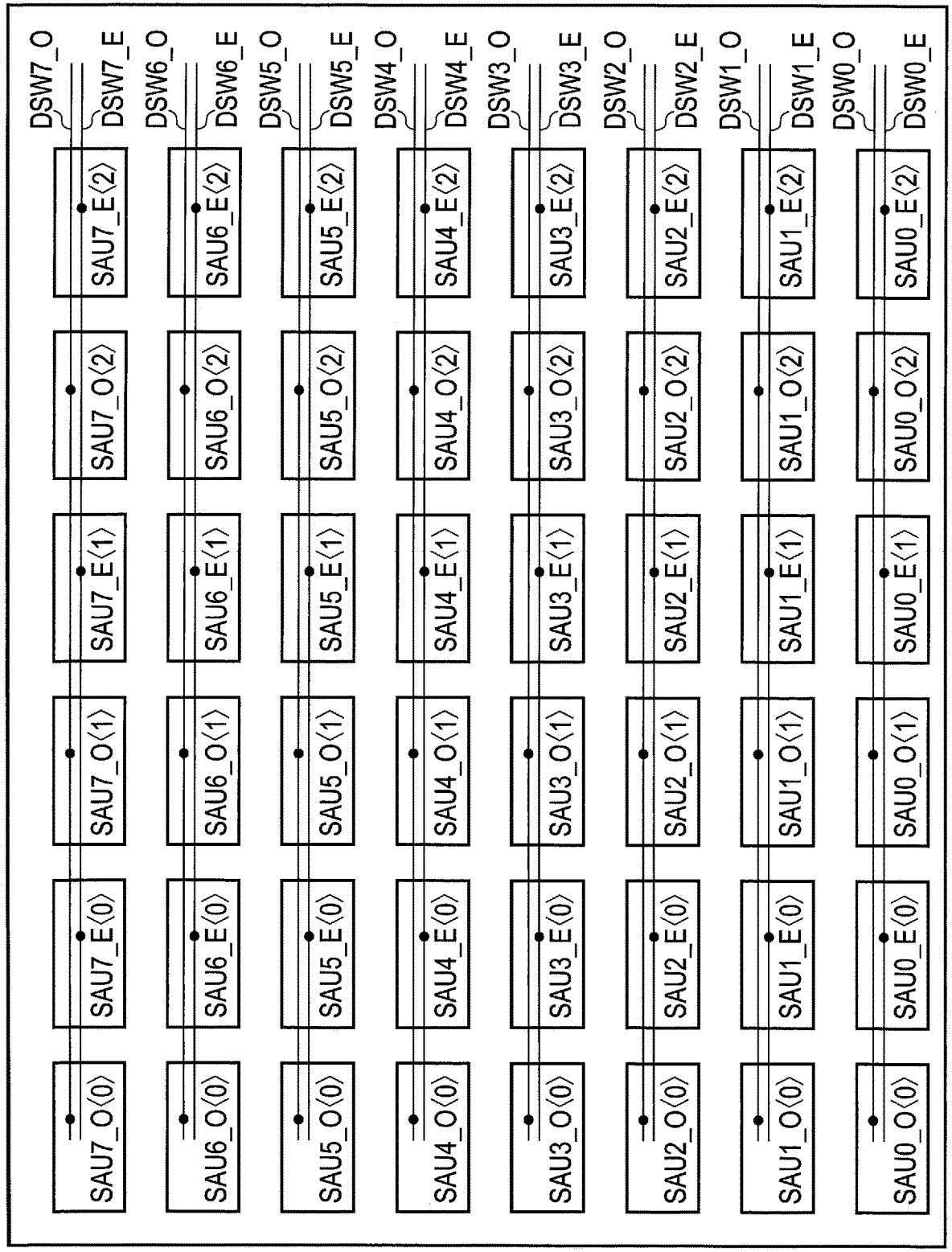
FIG. 13 is a plan view illustrating a plurality of sense amplifier units and a plurality of signal lines thereon of a NAND type flash memory according to a fourth embodiment.

FIG. 12 is a diagram illustrating a planar layout of a plurality of sense amplifier units SAU and a plurality of data latches XDL of a NAND type flash memory according to the fourth embodiment. FIG. 13 is a plan view corresponding to FIG. 4 of the first embodiment. In FIG. 13, black dots are indicative of connections between switches SW1 and signal lines DSW, similarly to the example of FIG. 4.

The present embodiment is different from the first embodiment in that 48 sense amplifier units SAUi_j<k> (i is 0, 1, . . . , 7, j is E, O, and k is 0, 1, 2) arranged in a matrix of 8 rows and 6 columns are used.

Sixteen sense amplifier units SAU (sense amplifier units SAU of the first-group) in the 1st row and 1st column to the 8th row and 2nd column are connected to sixteen data latches XDL in the 1st row and 1st column to the 16th row and 1st column via the data bus DBUS<0>.

Sixteen sense amplifier units SAU (sense amplifier units SAU of the second group) in the 1st row and 3rd column to the 8th row and 4th column are connected to sixteen data latches XDL in the 1st row and 2nd column to the 16th row and 2nd column via the data bus DBUS<1>.

Sixteen sense amplifier units SAU (sense amplifier units SAU of the third group) in the 1st row and 5th column to the 8th row and 6th column are connected to sixteen data latches XDL in the 1st row and 3rd column to the 16th row and 3rd column via the data bus DBUS<2>.

An example of transferring the data stored in the data latches XDL0_E<0>, XDL0_E<1>, and XDL0_E<2> respectively to the sense amplifier units SAU0_E<0>, SAU0_E<1>, and SAU0_E<2>, will be described.

An on signal is supplied to the signal line XTI0_E and an off signal is supplied to each of remaining fifteen signal lines XTI in FIG. 6. After that, an on signal is supplied to the signal line DSW0_E and an off signal is supplied to each of remaining fifteen signal lines DSW in FIG. 13.

In general, when the data stored in the data latches XDLi_j<0>, XDLi_j<1>, and XDLi_j<2> (i is 0, 1, ..., 7, and j is E, O) are respectively transferred to the sense amplifier units SAUi_j<0>, SAUi_j<1>, and SAUi_j<2>, an on signal is supplied to the signal lines XTIi_j and an off signal is supplied to each of remaining fifteen signal lines XTI, and then, an on signal is supplied to the signal lines DSWi_j and an off signal is supplied to each of remaining fifteen signal lines DSW.

In the present embodiment, similarly to the first embodiment, the dimension L1<the dimension L2 is established, so that the area of the sense amplifier unit SAU can be made smaller than the area of the data latches XDL, and increase in the chip area of the NAND type flash memory can be thereby suppressed.

Note that, in a case of FIG. 12, the dimensions of L1 and L2 may be determined to be 2L1<L2<3L1. This point will be further described below.

In the case of FIG. 12, there is a gap between the sense amplifier units SAU in the first column and the sense amplifier units SAU in the second column, which are adjacent in the column direction. The data latches XDL in the first column are arranged below the sense amplifier units SAU in the first and second columns. And in the case of FIG. 12, the dimension L2 of the data latches XDL is equal to the sum of the dimension L1 of the sense amplifier units SAU in the first column, the dimension L1 of the sense amplifier units SAU in the second column, and the dimension of the gap. The same applies to the sense amplifier units SAU of the other columns and the data latches XDL of the other columns. Therefore, in the case of FIG. 12, 2L1<L2 is achieved. L1<L2 is satisfied even in a case of 3L1≤L2, however unnecessary area that is not used for the sense amplifier units SAU increases, and thus it is better to employ the inequality 2L1<L2.

Note that, when one of two adjacent sense amplifier units SAU is provided in a layer higher than the other and the two adjacent sense amplifier units SAU are arranged to overlap, it is possible to achieve L2≤2L1. In addition, when one of two adjacent sense amplifier units SAU is provided in an upper layer than the other and the two adjacent sense amplifier units SAU are arranged to overlap, it is possible to achieve L2≥3L1.

Fifth Embodiment

Figure 14:
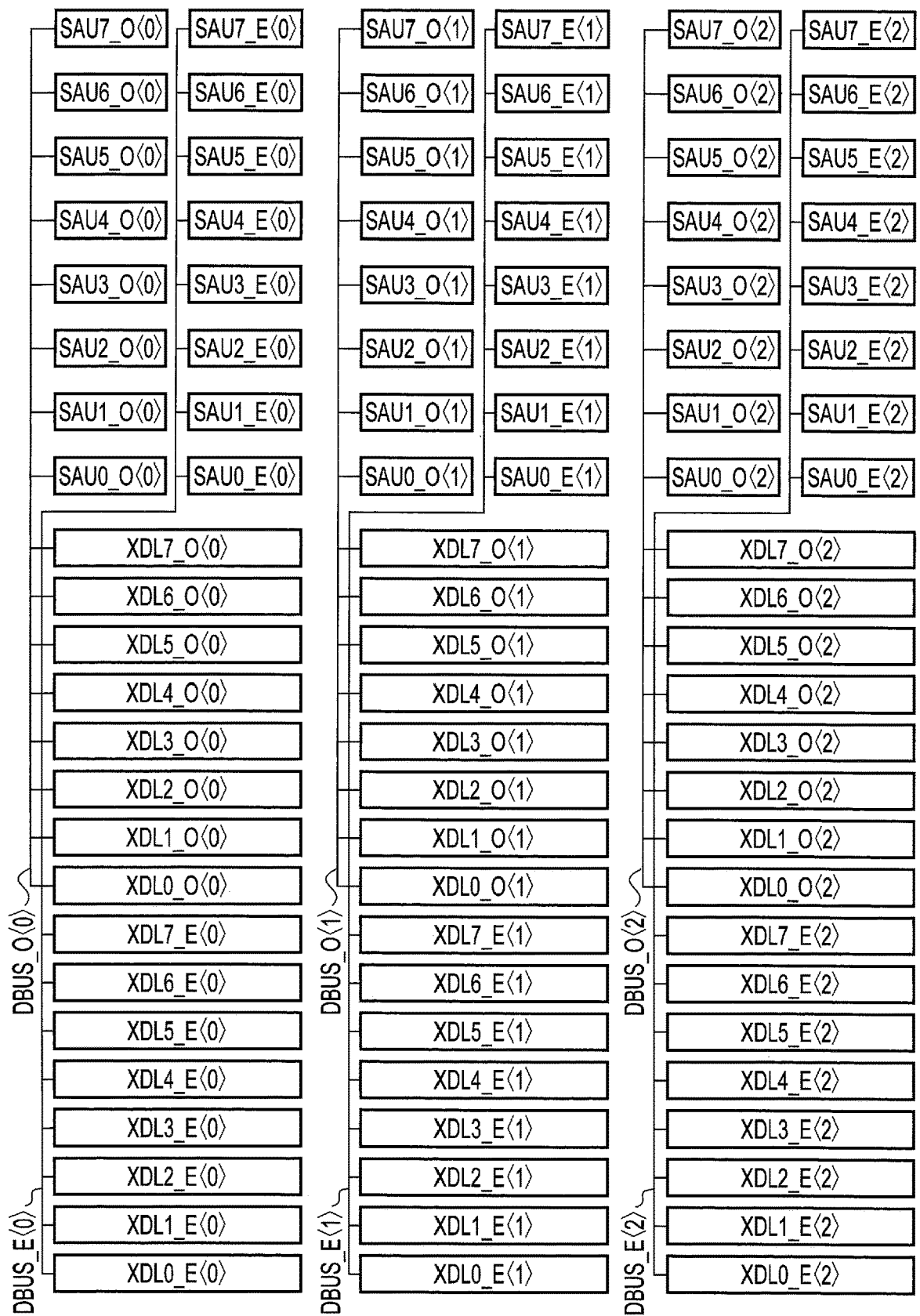
FIG. 14 is a diagram illustrating a planar layout of a plurality of sense amplifier units and a plurality of data latches of a NAND type flash memory according to a fifth embodiment.

FIG. 14 is a diagram illustrating a planar layout of a plurality of sense amplifier units SAU and a plurality of data latches XDL of a NAND type flash memory according to the fifth embodiment.

The present embodiment is different from the fourth embodiment in that two data buses DBUS<0>, two data buses DBUS<1>, and two data buses DBUS<2> are used.

In sense amplifier units SAU of the first group, the sense amplifier units SAUiE<0> (i is 0, 1, ..., 7) and the data latches XDLi_E<0> are connected by using the data bus DBUS_E<0>. In the sense amplifier units SAU of the first group, the sense amplifier units SAUi_O<0> and the data latches XDLi_O<0> are connected by using the data bus DBUS_O<0>. For example, the data bus DBUS_O<0> is provided in a layer higher than the data bus DBUS_E<0>. Alternatively, the data bus DBUS_O<0> may be provided in a layer lower than the data bus DBUS_E<0>, or the data bus DBUS_O<0> and the DBUS_E<0> may be provided in a same layer.

In sense amplifier units SAU of the second group, the sense amplifier units SAUi_E<1> (i is 0, 1, ..., 7) and the data latches XDLi_E<1> are connected by using the data bus DBUS_E<1>, the sense amplifier units SAUi_O<1> and the data latches XDLi_O<1> are connected by the data bus DBUS_O<1>. For example, the data bus DBUS_O<1> is provided in a layer higher than the data bus DBUS_E<1>. Alternatively, the data bus DBUS_O<1> may be provided in a layer lower than the data bus DBUS_E<1>, or the data bus DBUS_O<1> and the DBUS_E<1> may be provided in a same layer.

In sense amplifier units SAU of the third group, the sense amplifier units SAUi_E<2> (i is 0, 1, ..., 7) and the data latches XDLi_E<2> are connected by using the data bus DBUS_E<2>. In the sense amplifier units SAU of the third group, the sense amplifier units SAUi_O<2> and the data latches XDLi_O<2> are connected by using the data bus DBUS_O<2>. For example, the data bus DBUS_O<2> is provided in a layer higher than the data bus DBUS_E<2>. Alternatively, the data bus DBUS_O<2> may be provided in a layer lower than the data bus DBUS_E<2>, or the data bus DBUS_O<2> and the DBUS_E<2> may be provided in a same layer.

In the present embodiment, the time for data transfer can be reduced to half, similarly to the second embodiment.

In addition, similarly to the second embodiment, when the data stored in two data latches XDLi_E<k> and XDLi_O<k> (i is 0, 1, ..., 7, and k is 0, 1, 2) are transferred to two sense amplifier units SAUi_E<k> and SAUi_O<k> corresponding to the above sense amplifier units, an on signal is supplied to the signal lines XTIi_E and XTIi_O and an off signal is supplied to each of the other signal lines XTI, and then, an on signal is supplied to the signal lines DSWi_E and DSWi_O and an off signal is supplied to each of the other signal lines DSW.

In contrast, when the data stored in two sense amplifier units SAUi_E<k> and SAUi_O<k> are transferred to two data latches XDLi_E<k> and XDLi_O<k> corresponding to the above sense amplifier units, an on signal is supplied to the signal lines DSWi_E and DSWi_O and an off signal is supplied to each of the other signal lines DSW, and then, an on signal is supplied to the signal lines XTIi_E and XTIi_O and an off signal is supplied to each of the other signal lines XTI.

Sixth Embodiment

FIG. 15 is a diagram illustrating a planar layout of a plurality of sense amplifier units SAU and a plurality of data latches XDL of a NAND type flash memory according to the sixth embodiment.

The present embodiment is different from the fourth embodiment in that four data buses DBUS<0>, four data buses DBUS<1>, and four data buses DBUS<2> are used.

In sense amplifier units SAU of the first group, the sense amplifier units SAUiE<0> (i is 0, 1, 2, 3) and the data latches XDLi_E<0> (i is 0, 1, 2, 3) are connected by using the data bus DBUS_1E<0>. In the sense amplifier units SAU of the first group, the sense amplifier units SAUi_E<0> (i is 4, 5, 6, 7) and the data latches XDLi_E<0> (i is 4, 5, 6, 7) are connected by using the data bus DBUS_2E<0>. In the sense amplifier units SAU of the first group, the sense amplifier units SAUi_O<0> (i is 0, 1, 2, 3) and the data latches XDLi_O<0> (i is 0, 1, 2, 3) are connected by using the data bus DBUS_1O<0>. In the sense amplifier units SAU of the first group, the sense amplifier units SAUi_O<0> (i is 4, 5, 6, 7) and the data latches XDLi_O<0> (i is 4, 5, 6, 7) are connected by using the data bus DBUS_2O<0>. For example, the data buses DBUS_1O<0> is provided in a layer higher than the data bus DBUS_1E<0>, and the data bus DBUS_2E<0> and the data bus DBUS_1E<0> are provided in a same layer. Note that, a vertical positional relation (higher, lower, same) of four regions on which the four data buses are respectively provided is appropriately determined.

In sense amplifier units SAU of the second group, the sense amplifier units SAUi_E<1> (i is 0, 1, 2, 3) and the data latches XDLi_E<1> (i is 0, 1, 2, 3) are connected by using the data bus DBUS_1E<1>. In the sense amplifier units SAU of the second group, the sense amplifier units SAUiE<1> (i is 0, 1, . . . , 7) and the data latches XDLi_E<1> (i is 4, 5, 6, 7) are connected by using the data bus DBUS_2E<1>. In the sense amplifier units SAU of the second group, the sense amplifier units SAUi_O<1> (i is 0, 1, 2, 3) and the data latches XDLi_O<1> is 0, 1, 2, 3) are connected by using the data bus DBUS_1O<1>. In the sense amplifier units SAU of the second group, the sense amplifier units SAUi_O<1> (i is 4, 5, 6, 7) and the data latches XDLi_O<1> (i is 4, 5, 6, 7) are connected by using the data bus DBUS_2O<0>. For example, the data buses DBUS_2E<1> is provided in a layer higher than the data bus DBUS_1E<1>, the data bus DBUS_2O<1> is provided in a layer higher than the DBUS_1O<1>, and the data bus DBUS_1E<1> and the data bus DBUS_1O<1> are provided in a same layer. Note that, a vertical positional relation (higher, lower, same) of four regions on which the four data buses are respectively provided is appropriately determined.

In sense amplifier units SAU of the third group, the sense amplifier units SAUiE<2> (i is 0, 1, 2, 3) and the data latches XDLi_E<2> (i is 0, 1, 2, 3) are connected by using the data bus DBUS_1E<2>. In the sense amplifier units SAU of the third group, the sense amplifier units SAUiE<2> (i is 4, 5, 6, 7) and the data latches XDLi_E<2> (i is 4, 5, 6, 7) are connected by using the data bus DBUS_2E<2>. In the sense amplifier units SAU of the third group, the sense amplifier units SAUi_O<2> (i is 0, 1, 2, 3) and the data latches XDLi_O<2> (i is 0, 1, 2, 3) are connected by using the data bus DBUS_1O<2>. In the sense amplifier units SAU of the third group, the sense amplifier units SAUi_O<2> (i is 4, 5, 6, 7) and the data latches XDLi_O<2> (i is 4, 5, 6, 7) are connected by using the data bus DBUS_2O<2>. For example, the data buses DBUS_2E<2> is provided in a layer higher than the data bus DBUS_1E<2>, the data bus DBUS_2O<2> is provided in a layer higher than data bus DBUS_1O<2>, and the data bus DBUS_1E<2> and the data bus DBUS_1O<2> are provided in a same layer. Note that, a vertical positional relation (higher, lower, same) of four regions on which the four data buses are respectively provided is appropriately determined.

In the present embodiment, the time for data transfer can be reduced to quarter, similarly to the third embodiment.

In addition, similarly to the third embodiment, when the data stored in the data latches XDLi_E<k>, XDL(i+4)_E<k>, XDLi_O<k>, and XDL(i+4)_O<k> (i is 0, 1, 2, 3, and k is 0, 1, 2) are transferred to the sense amplifier units SAUiE<k>, SAU(i+4)_E<k>, SAUi_O<k>, and SAU(i+4)_0<k> corresponding thereto, an on signal is supplied to the signal lines XTIi_E, XTI(i+4)_E, XTIi_O, and XTI (i+4)_O and an off signal is supplied to each of the other signal lines XTI, and then, an on signal is supplied to the signal lines DSWi_E, DSW(i+4)_E, DSWi_O, and DSW(i+4)_O and an off signal is supplied to each of the other signal lines DSW.

In contrast, when the data stored in the sense amplifier units SAUi_E<k>, SAU(i+4)_E<k>, SAUi_O<k>, and SAU(i+4) 0<k> (i is 0, 1, 2, 3 and k is 0, 1, 2) are transferred to the data latches XDLi_E<k>, XDL(i+4)_E<k>, XDLi_O<k>, and XDL(i+4) 0<k> corresponding thereto, an on signal is supplied to the signal lines DSWi_E, DSW(i+4)_E, DSWi_O, and DSW(i+4)_O and an off signal is supplied to each of the other signal lines DSW, and then, an on signal is supplied to the signal lines XTIi_E, XTI(i+4)_E, XTIi_O, and XTI(i+4)_O and an off signal is supplied to each of the other signal lines XTI.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a memory cell array including a plurality of memory cells;
    a plurality of bit lines connected to the memory cell array;
    a plurality of sense amplifier units provided to correspond to the plurality of bit lines and arranged in a matrix of M rows and N columns; and
    a plurality of data latches provided to correspond to the plurality of sense amplifier units and arranged in a matrix of S rows and T columns,
    wherein
    M, N, S, and T are positive integers, satisfying M<S, N>T, and S×T=M×N, and
    a dimension of each of the sense amplifier units in an arrangement direction of the N columns is smaller than a dimension of each of the data latches in an arrangement direction of the T columns.

2. The semiconductor storage device according to claim 1, wherein
    L1:L2=T:N, where L1 is the dimension of each of the sense amplifier unit, and L2 is the dimension of each of the data latch.

3. The semiconductor storage device according to claim 2, wherein
    a dimension of each of the sense amplifier units in the arrangement direction of the M rows is larger than a dimension of each of the data latches in the arrangement direction of the S rows.

4. The semiconductor storage device according to claim 1, wherein
    number of the plurality of bit lines is M×N.

5. The semiconductor storage device according to claim 1, wherein
    the plurality of sense amplifier units are classified into a plurality of groups, number of the sense amplifier units in each group is S, and the S sense amplifier units in the same group are connected to S data latches in the same column of the plurality of data latches.

6. The semiconductor storage device according to claim 5, wherein
the N is 4, and the T is 3,
the plurality of sense amplifier units are classified into a first group, a second group, and a third group,
the first group includes M sense amplifier units arranged in 1st row and 1st column to M-th row and 1st column, and (S−M) sense amplifier units arranged in (2M−S+1)-th row and 2nd column to M-th row and 2nd column,
the second group includes (2M−S) sense amplifier units arranged in 1st row and 2nd column to (2M−S)-th row and 2nd column, and (2M−S) sense amplifier units arranged in (S−M+1)-th row and 3rd column to M-th row and 3rd column, and
the third group includes (S−M) sense amplifier units arranged in 1st row and 3rd column to (S−M)-th row and 3rd column, and M sense amplifier units arranged in 1st row and 4th column to M-th row and 4th column.

7. The semiconductor storage device according to claim 6, wherein
the N is 6, and the T is 3,
the plurality of sense amplifier units are classified into a first group, a second group, and a third group,
the first group includes M sense amplifier units arranged in 1st row and 1st column to M-th row and 1st column, and M sense amplifier units arranged in 1st row and 2nd column to M-th row and 2nd column,
the second group includes M sense amplifier units arranged in 1st row and 3rd column to M-th row and 3rd column, and M sense amplifier units arranged in 1st row and 4th column to M-th row and 4th column, and
the third group includes M sense amplifier units arranged in 1st row and 5th column to M-th row and 5th column, and M sense amplifier units arranged in 1st row and 6th column to M-th row and 6th column.

8. The semiconductor storage device according to claim 6, further comprising:
one or more first data buses, one or more second data buses, and one or more third data buses,
wherein
the S sense amplifier units of the first group are connected to S data latches in 1st row and 1st column to S-th row and 1st column of the plurality of data latches via the one or more first data buses,
the S sense amplifier units of the second group are connected to S data latches in 1st row and 2nd column to S-th row and 2nd column of the plurality of data latches via the one or more second data buses, and
the S sense amplifier units of the third group are connected to S data latches in 1st row and 3rd column to S-th row and 3rd column of the plurality of data latches via the one or more third data buses.

9. The semiconductor storage device according to claim 8, further comprising:
2M first interconnects provided on the plurality of sense amplifier units,
wherein
every two of the 2M first interconnects are provided on N sense amplifier units in each row of the plurality of sense amplifier units.

10. The semiconductor storage device according to claim 9 wherein
each of the plurality of sense amplifier units includes a sense amplifier circuit and a first switching element, and turning on/off the first switching element is controlled by a control signal from any one of the 2M first interconnects.

11. The semiconductor storage device according to claim 10, further comprising:
S second interconnects provided on the plurality of data latches,
wherein
every one of the M first interconnects are provided on T data latches in each row of the plurality of data latches.

12. The semiconductor storage device according to claim 11, further comprising:
a controller configured to control first control signals supplied to the 2M first interconnects and second control signals supplied to the M second interconnects.

13. The semiconductor storage device according to claim 9, wherein
each of the sense amplifier units includes a first transistor, each of the data latches includes a second transistor, and a drive performance of the first transistor is lower than a drive performance of the second transistor.

* * * * *